US012721236B2

(12) United States Patent
Zhang

(10) Patent No.: US 12,721,236 B2
(45) Date of Patent: Aug. 25, 2026

(54) MEMORY CHIP, LOGIC CHIP, CHIP-STACKED STRUCTURE, AND MEMORY

(71) Applicant: CXMT CORPORATION, Hefei (CN)

(72) Inventor: Jiarui Zhang, Hefei (CN)

(73) Assignee: CXMT CORPORATION, Hefei (CN)

(*) Notice: Subject to any disclaimer, the term of this patent is extended or adjusted under 35 U.S.C. 154(b) by 93 days.

(21) Appl. No.: 18/943,754

(22) Filed: Nov. 11, 2024

(65) Prior Publication Data

US 2025/0201796 A1 Jun. 19, 2025

Related U.S. Application Data

(63) Continuation of application No. PCT/CN2023/141886, filed on Dec. 26, 2023.

(30) Foreign Application Priority Data

Dec. 18, 2023 (CN) ........................ 202311748315.X

(51) Int. Cl.
*H10W 90/00* (2026.01)
*H03K 19/17736* (2020.01)
(Continued)

(52) U.S. Cl.
CPC ........ *H10W 90/00* (2026.01); *H03K 19/1774* (2013.01); *H03K 19/21* (2013.01); *H10W 90/297* (2026.01)

(58) Field of Classification Search
None
See application file for complete search history.

(56) References Cited

U.S. PATENT DOCUMENTS

2010/0127758 A1* 5/2010 Hollis ...................... G11C 5/02 327/526
2012/0092062 A1* 4/2012 Lee ...................... H10P 74/232 327/525

(Continued)

FOREIGN PATENT DOCUMENTS

CN 102569255 A 7/2012
CN 102576564 A 7/2012

(Continued)

OTHER PUBLICATIONS

ISA State Intellectual Property Office of the People's Republic of China, International Search Report Issued in Application No. PCT/CN2023/141886, Jun. 21, 2024, WIPO, 8 pages.

*Primary Examiner* — Jany Richardson
(74) *Attorney, Agent, or Firm* — Syncoda LLC; Feng Ma

(57) ABSTRACT

Provided are a memory chip, a logic chip, a chip-stacked structure, and a memory. A global signal region of the memory chip is penetrated by multiple conductive via groups, and each conductive via group includes a first dummy conductive via group and a second dummy conductive via group. The first dummy conductive via group includes a first conductive via and a fourth conductive via, and the second dummy conductive via group includes a second conductive via and a third conductive via. The first dummy conductive via group is configured to transmit the same first global signal, and the second dummy conductive via group is configured to transmit the same second global signal.

20 Claims, 24 Drawing Sheets

(51) Int. Cl.
*H03K 19/21* (2006.01)
*H10W 90/20* (2026.01)

(56) References Cited

U.S. PATENT DOCUMENTS

2014/0340113 A1* 11/2014 Tseng .................. H03K 19/003
326/9
2018/0374779 A1* 12/2018 Park ...................... G11C 5/025
2023/0377679 A1 11/2023 Lee

FOREIGN PATENT DOCUMENTS

| | | | |
|---|---|---|---|
| CN | 102751261 | A | 10/2012 |
| CN | 111402945 | A | 7/2020 |
| CN | 113097198 | A | 7/2021 |
| CN | 113348546 | A | 9/2021 |
| CN | 115631783 | A | 1/2023 |
| CN | 116190358 | A | 5/2023 |

* cited by examiner

MEMORY CHIP, LOGIC CHIP, CHIP-STACKED STRUCTURE, AND MEMORY

CROSS-REFERENCE TO RELATED APPLICATIONS

The present disclosure is a continuation of PCT/CN2023/141886, filed on Dec. 26, 2023, which claims priority to Chinese Patent Application No. 202311748315.X, filed with the China National Intellectual Property Administration on Dec. 18, 2023 and entitled "MEMORY CHIP, LOGIC CHIP, CHIP-STACKED STRUCTURE, AND MEMORY", which are incorporated herein by reference in their entireties.

TECHNICAL FIELD

The present disclosure relates to but is not limited to a memory chip, a logic chip, a chip-stacked structure, and a memory.

BACKGROUND

With the development of integrated circuit technologies, significant progress has been made in manufacturing processes of semiconductor devices. However, in recent years, the development of two-dimensional semiconductor technologies has encountered various challenges such as a physical limit, an existing developing technology limit, and a storage electron density limit. In this context, to address the difficulties encountered by two-dimensional semiconductor devices and pursue lower manufacturing costs per memory cell, multiple chips may be stacked through a bonding process (e.g., hybrid bonding, bumping, or wire bonding) to form a three-dimensional semiconductor device. However, for the three-dimensional semiconductor device, a connection structure between different chips still has problems such as high parasitic capacitance and high parasitic resistance, affecting signal transmission quality.

SUMMARY

Embodiments of the present disclosure provide a memory chip, a logic chip, a chip-stacked structure, and a memory.

According to a first aspect, an embodiment of the present disclosure provides a memory chip. A center point of an active surface of the memory chip and an adjacent region of the center point are defined as a global signal region, and a center point of the global signal region coincides with the center point of the active surface.

The global signal region is penetrated by multiple conductive via groups, and each conductive via group includes a first dummy conductive via group and a second dummy conductive via group. The first dummy conductive via group includes a first conductive via and a fourth conductive via, and the second dummy conductive via group includes a second conductive via and a third conductive via. The first dummy conductive via group is configured to transmit the same first global signal, and the second dummy conductive via group is configured to transmit the same second global signal.

For each conductive via group, the first conductive via and the second conductive via are symmetric about a first axis, the third conductive via and the fourth conductive via are symmetric about the first axis, and the first conductive via and the fourth conductive via are symmetric about a second axis. The first axis and the second axis are perpendicular to each other and intersect at the center point of the active surface, the first axis is parallel to a first side edge of the memory chip, and the second axis is parallel to a second side edge of the memory chip.

According to a second aspect, an embodiment of the present disclosure provides a logic chip. A center point of an active surface of the logic chip and an adjacent region of the center point are defined as a global signal region, and a center point of the global signal region coincides with the center point of the active surface.

The global signal region is penetrated by multiple conductive via groups, and each conductive via group includes a first dummy conductive via group and a second dummy conductive via group. The first dummy conductive via group includes a first conductive via and a fourth conductive via, and the second dummy conductive via group includes a second conductive via and a third conductive via. The first dummy conductive via group is configured to transmit the same first global signal, and the second dummy conductive via group is configured to transmit the same second global signal.

For each conductive via group, the first conductive via and the second conductive via are symmetric about a first axis, the third conductive via and the fourth conductive via are symmetric about the first axis, and the first conductive via and the fourth conductive via are symmetric about a second axis. The first axis and the second axis are perpendicular to each other and intersect at the center point of the active surface, the first axis is parallel to a first side edge of the logic chip, and the second axis is parallel to a second side edge of the logic chip.

According to a third aspect, an embodiment of the present disclosure provides a chip-stacked structure. The chip-stacked structure includes the logic chip according to any implementation of the second aspect and at least one stacked unit, and the logic chip and the at least one stacked unit are sequentially stacked in a third direction. Each stacked unit includes a first memory chip, a second memory chip, a third memory chip, and a fourth memory chip that are sequentially stacked in the third direction, and the third direction is perpendicular to a top surface of each memory chip. Each of the first memory chip, the second memory chip, the third memory chip, and the fourth memory chip is the memory chip according to any implementation of the first aspect.

The first memory chip and the second memory chip are stacked in a face-to-face manner, the second memory chip and the third memory chip are stacked in a back-to-back manner, and the third memory chip and the fourth memory chip are stacked in the face-to-face manner.

A first memory chip in the first stacked unit and the logic chip are stacked in a back-to-face manner, or a first memory chip in the first stacked unit and the logic chip are stacked in the back-to-back manner. In addition, n conductive via groups in the logic chip are in a one-to-one correspondence with and aligned in the third direction with n conductive via groups in each first memory chip, n conductive via groups in each second memory chip, n conductive via groups in each third memory chip, and n conductive via groups in each fourth memory chip, where n is a positive integer.

According to a fourth aspect, an embodiment of the present disclosure provides a memory. The memory includes the chip-stacked structure according to any implementation of the third aspect.

DESCRIPTION OF EMBODIMENTS

The technical solutions in the embodiments of the present disclosure are clearly described below with reference to the accompanying drawings in the embodiments of the present disclosure. It may be understood that specific embodiments described herein are merely intended to explain the related application, but are not intended to limit the present disclosure. In addition, it should be further noted that for ease of description, only a part related to the related application is shown in the accompanying drawings.

Unless otherwise defined, all technical and scientific terms utilized in this specification have meanings the same as those commonly understood by a person skilled in the technical field of the present disclosure. The terms utilized in this specification are merely intended to describe the embodiments of the present disclosure, but are not intended to limit the present disclosure.

The following descriptions relate to "some embodiments" describing a subset of all possible embodiments. However, it may be understood that "some embodiments" may be the same subset or different subsets of all the possible embodiments, and may be combined with each other when there is no conflict.

It should be noted that the term "first/second/third" in the embodiments of the present disclosure is merely intended to distinguish between similar objects, and does not represent specific sorting for the objects. It may be understood that "first/second/third" may be interchanged for a specific sequence or order if allowed, so that the embodiments of the present disclosure described herein can be implemented in a sequence other than those shown or described herein.

Before the embodiments of the present disclosure are described, three directions that may be configured to describe a three-dimensional structure of a plane in the following embodiments are first defined. In an example of a Cartesian coordinate system, the three directions may include a first direction, a second direction, and a third direction.

Figure 1:
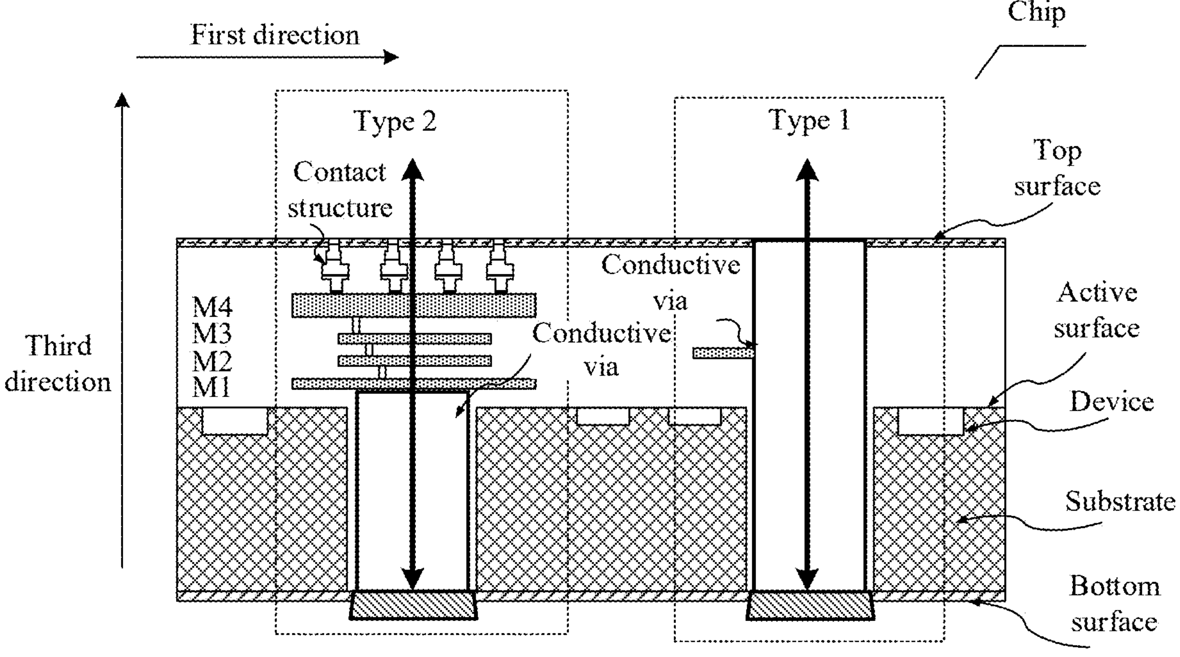
FIG. 1 is a schematic structural diagram of a chip.

Referring to FIG. 1, a semiconductor chip (which may be specifically a memory chip or a logic chip) may include a top surface located on the front and a bottom surface located on the back opposite to the front. When flatness of the top surface and the bottom surface is ignored, a direction intersecting with (e.g., perpendicular to) the top surface and the bottom surface of the semiconductor chip is defined as the third direction. Two directions, that is, the first direction and the second direction, that are perpendicular to each other are defined on the top surface of the semiconductor chip. The first direction is perpendicular to an edge of the semiconductor chip, and the second direction is perpendicular to another edge of the semiconductor chip.

Referring to FIG. 1, the semiconductor chip includes a substrate, and an active surface is formed on a surface that is of the substrate and that is configured to manufacture a device (e.g., a transistor or a capacitor) (a surface that is of the substrate and that is opposite to the active surface is a non-active surface, that is, the bottom surface in FIG. 1). Multiple metal layers are distributed between the substrate and the top surface of the semiconductor chip, e.g., M1, M2, and M3. Two types of conductive vias (e.g., through-silicon vias) are further shown in FIG. 1, and are both configured to implement signal connections between different stacked chips.

As shown in FIG. 1, a conductive via of a type 1 penetrates through the bottom surface and the top surface in the third direction, and the conductive via is connected to an internal circuit of the chip through the metal layer.

As shown in FIG. 1, a conductive via of a type 2 penetrates only through the substrate (penetrates through the active surface and the bottom surface) in the third direction, and needs to cooperate with a contact structure penetrating through the top surface in the third direction to jointly implement signal transmission. The contact structure and the conductive via are not directly electrically connected, but indirectly electrically connected through the metal layer. For example, the contact structure in FIG. 1 is connected to M4, M4 is sequentially connected to M1 through M3 and M2, and M1 is connected to the conductive via. Alternatively, the conductive via in FIG. 1 is connected to an input terminal of the internal circuit (the device in the substrate in FIG. 1) of the chip through M1 to M4, and an output signal processed by the internal circuit of the chip is then output to the corresponding contact structure through the metal layers M1 to M4. Similarly, the contact structure in FIG. 1 may also be connected to the input terminal of the internal circuit (the device in the substrate in FIG. 1) of the chip through M1 to M4, and the output signal processed by the internal circuit of the chip is then output to the corresponding conductive via through M1 to M4. Certainly, in another embodiment, the contact structure and the conductive via may alternatively be designed to be directly electrically connected.

In addition, types of conductive vias are not limited to the foregoing two types, which are merely examples. In particular, the illustrations presented in the present disclosure are not meant to be actual views of any specific microelectronic apparatus or components thereof, but are only idealized representations for describing illustrative embodiments. Therefore, the illustrations are not necessarily drawn to scale.

The embodiments of the present disclosure are described below in detail with reference to the accompanying drawings.

In an embodiment, a memory chip and a logic chip are provided. The memory chip/logic chip includes multiple conductive vias penetrating through the chip in a third direction. The conductive vias are configured to implement signal transmission between different chips, and all the conductive vias may be located at any location. In particular, every four conductive vias may be considered as one conductive via group in terms of function, but respective locations of the four conductive vias are not limited.

Figure 2A:
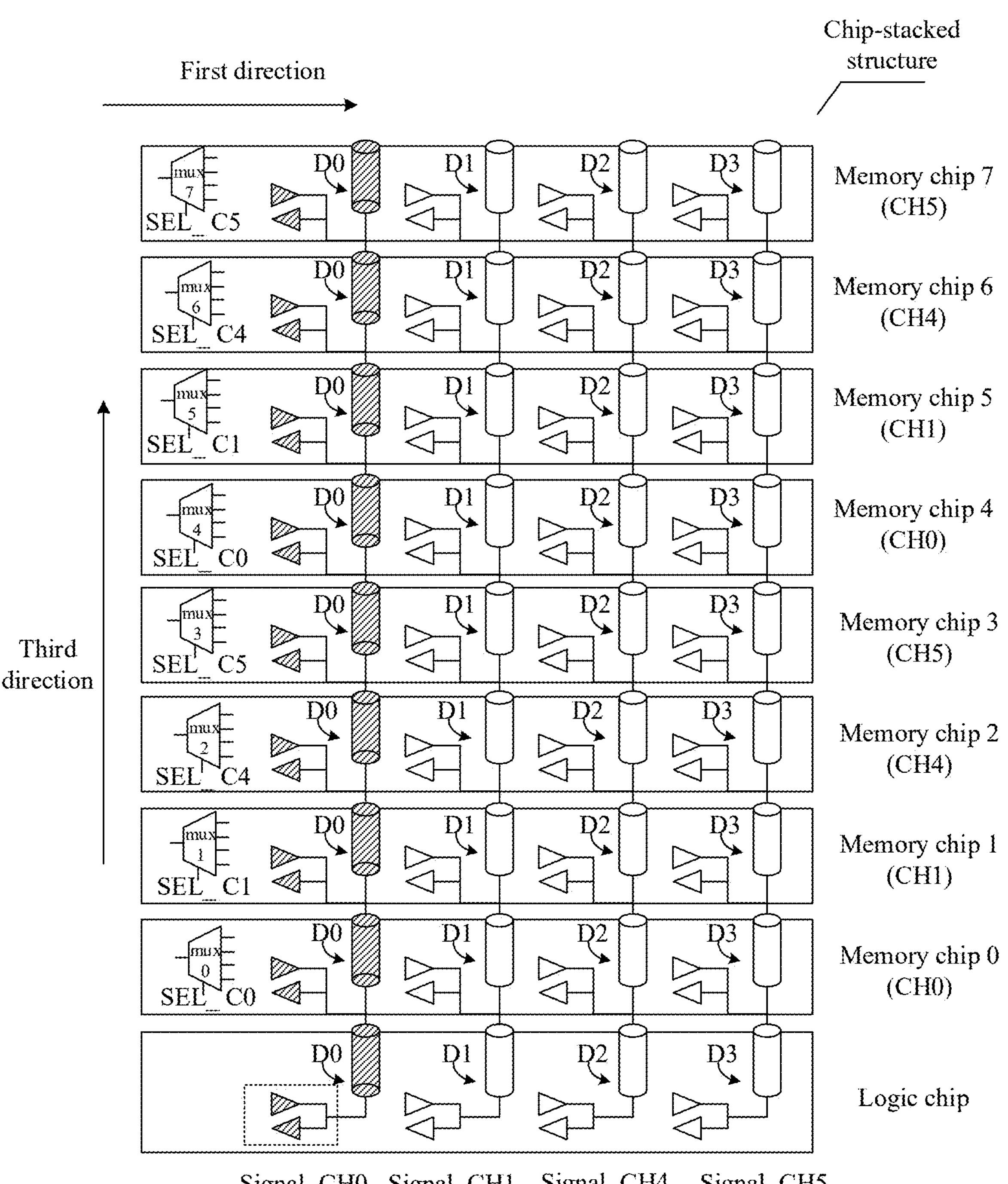
FIG. 2A is a schematic diagram 1 of signal transmission in a chip-stacked structure.

In a specific embodiment, eight memory chips and one logic chip are stacked to form a 3D memory device, respective conductive vias of the eight memory chips are aligned in the third direction, and nine conductive vias aligned in the third direction are connected to form one electrical path. FIG. 2A is a schematic diagram 1 of signal transmission in a chip-stacked structure. As shown in FIG. 2A, the chip-stacked structure includes memory chips 0~7 and a logic chip. In FIG. 2A, only four conductive vias D0~D3 are shown for each memory chip, and the four conductive vias D0~D3 belong to the same conductive via group. In this case, conductive vias D0 in the eight memory chips and one logic chip are all aligned to form one electrical path, conductive vias D1 in the eight memory chips and one logic chip are all aligned to form one electrical path, and there is a similar case for the remaining conductive vias.

In addition, multiple drive circuits are further disposed in each memory chip and the logic chip (in FIG. 2A, only one drive circuit is shown in a dotted-line box, and the remaining drive circuits are not shown in a box), and each conductive via is connected to one drive circuit. Multiple data selectors (e.g., mux0~mux7 in FIG. 2A) are further disposed in each memory chip, and each conductive via group corresponds to one data selector, that is, all conductive vias in one conductive via group are connected to a data port of the data selector through respective drive circuits. That is, the data selector may choose to output, to the inside of the memory chip, a signal transmitted by a specific conductive via or input, to a specific conductive via, a signal output by the memory chip.

For an overall memory device, different regions in different memory chips are classified into different channels (e.g., CH0, CH1, CH4, and CH5) for management. A signal Signal_CH0 on the channel CH0 is transmitted through an electrical path including "the conductive via D0 in the logic chip and the conductive via D0 in the memory chip 0—the conductive via D0 in the memory chip 1—the conductive via D0 in the memory chip 2—the conductive via D0 in the memory chip 3—the conductive via D0 in the memory chip 4—the conductive via D0 in the memory chip 5—the conductive via D0 in the memory chip 6—the conductive via D0 in the memory chip 7". Selection signals of a data selector mux0 in the memory chip 0 and a data selector mux4 in the memory chip 4 are both SEL_C0, that is, the signal Signal_CH0 may enter the memory chip 0 and the memory chip 4 through the foregoing electrical path. A signal output procedure may be similarly understood.

It may be learned from the foregoing description that the memory chip 0 needs to obtain a signal only from the conductive via D0, the memory chip 1 needs to obtain a signal only from the conductive via D1, and so on. That is, each memory chip needs to obtain a signal only from one conductive via in a conductive via group. It should be noted that different memory chips may need to obtain signals from different conductive vias. However, during process manufacturing, all the memory chips need to be designed into the exactly same structure (to maximize cost and labor savings). Therefore, all conductive vias in the memory chips need to be designed with corresponding drive structures and data selectors, to implement structural consistency. Further, when the chip-stacked structure shown in FIG. 2A is utilized, each conductive via corresponds to one drive circuit; and all drive circuits in all memory chips on the same channel need to be driven in a working procedure of the chip-stacked structure, resulting in a relatively heavy load and relatively high parasitic capacitance. This severely affects performance of the chips in the chip-stacked structure, restricts transmission efficiency, increases power consumption, and restricts a quantity of stacked chips in a three-dimensional device.

Figure 2B:
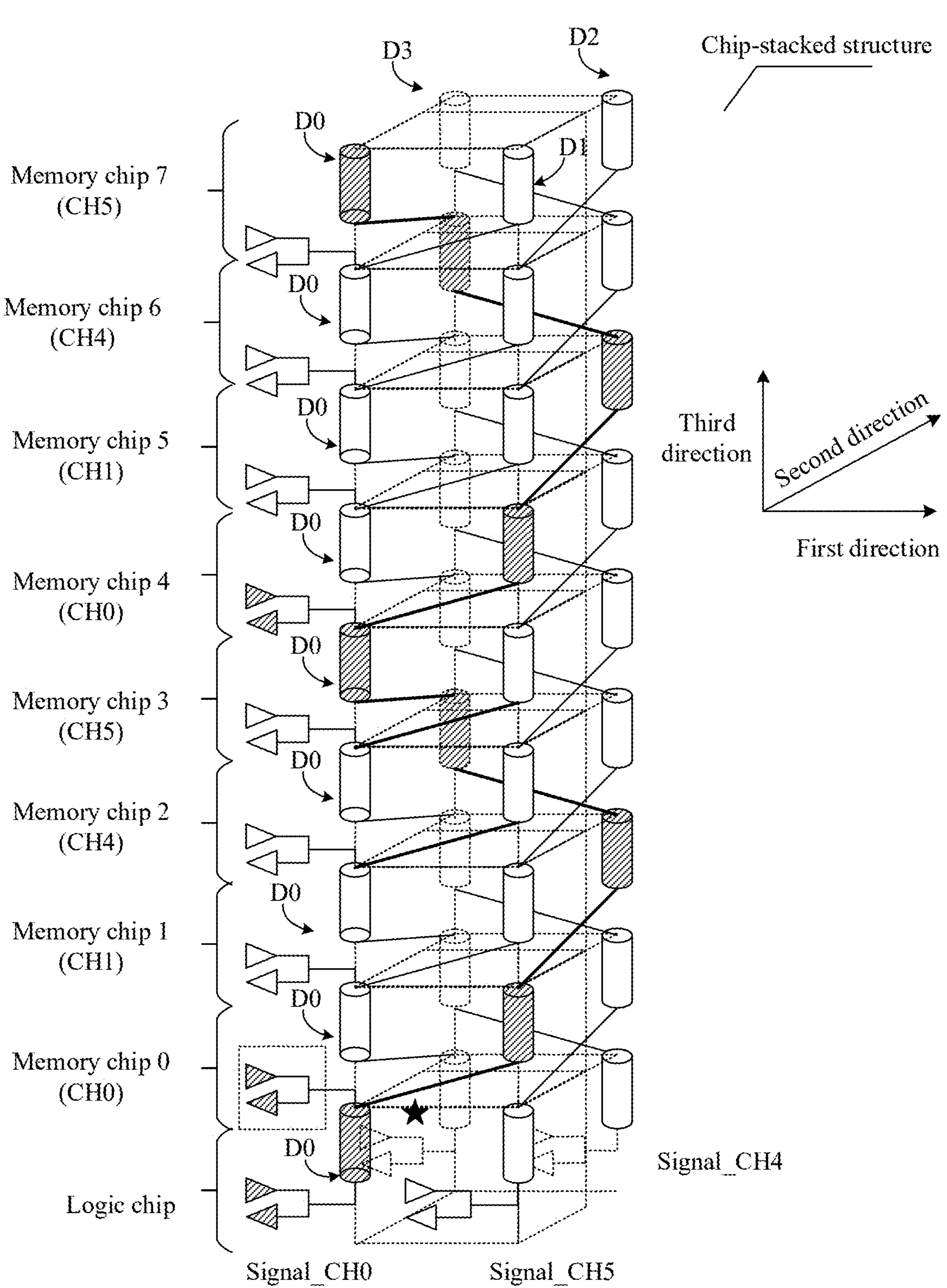
FIG. 2B is a schematic diagram 2 of signal transmission in a chip-stacked structure.

In another embodiment, FIG. 2B is a schematic diagram 2 of signal transmission in a chip-stacked structure. In particular, in FIG. 2B, only some conductive vias (D0~D3) are identified, and other conductive vias are omitted. However, for FIG. 2B, identifiers of conductive vias aligned in a third direction are the same. As shown in FIG. 2B, the chip-stacked structure also includes eight memory chips and one logic chip that are aligned in the third direction. However, each of conductive vias in each memory chip is rotatably connected to another conductive via at a different location in another memory chip, to implement an overall spiral upward connection. That is, a signal Signal_CH0 on a channel CH0 is transmitted through "a conductive via D0 in the logic chip—a conductive via D1 in a memory chip 0—a conductive via D2 in a memory chip 1—a conductive via D3 in a memory chip 2—a conductive via D0 in a memory chip 3—a conductive via D1 in a memory chip 4—a conductive via D2 in a memory chip 5—a conductive via D3 in a memory chip 6—a conductive via D0 in a memory chip 7", and there is a similar case for the remaining signals.

In this way, the memory chip 0 can obtain the signal Signal_CH0 through an output terminal of the conductive via D0 in the logic chip, the memory chip 1 can obtain a signal Signal_CH1 through an input terminal of a conductive via D0 in the memory chip 0, the memory chip 2 can obtain a signal Signal_CH4 through an input terminal of a conductive via D0 in the memory chip 1, the memory chip 3 can obtain a signal Signal_CH5 through an input terminal of a conductive via D0 in the memory chip 2, and so on. For each memory chip, only one conductive via in each conductive via group needs to be connected to a drive circuit, and no data selector needs to be disposed. This can reduce a quantity of devices, and therefore reduce parasitic capacitance. However, compared with the direct connection configuration of conductive vias in FIG. 2A, the process of rotatably connecting conductive vias in FIG. 2B is more complex. Specifically, an interconnection structure in a horizontal direction needs to be disposed between adjacent conductive vias in each memory chip in FIG. 2B (only one interconnection structure is marked with a five-pointed star in FIG. 2B). The signal interconnection structure may be a metal interconnection line, a conductive via, or the like. To implement the rotational connection between conductive vias, the input signal signal_CH0 needs to be first transmitted upward from the conductive via D0 in the logic chip to an interconnection structure (not connected to the conductive via D0 in the memory chip 0) below the conductive via D0 in the memory chip 0, and then horizontally transmitted from the interconnection structure below the conductive via D0 in the memory chip 0 to the conductive via D1 in the memory chip 0. That is, in the structure shown in FIG. 2B, the input signal further needs to pass through the interconnection structure in each memory chip, and there is a similar case for an output signal. This inevitably increases parasitic resistance and increases the process complexity.

In particular, in the chip-stacked structures shown in FIG. 2A and FIG. 2B, active surfaces of all the chips face upward, that is, different memory chips are stacked back-to-face, and the memory chip and the logic chip are also stacked back-to-face, that is, a bottom surface of an upper chip is in contact with a top surface of a lower chip.

In conclusion, on one hand, in the chip-stacked structure in FIG. 2A, a relatively large quantity of conductive vias need to be disposed to transmit corresponding signals, and corresponding drive circuits and data selectors are further provided, resulting in a relatively heavy load and relatively high parasitic capacitance, and in the chip-stacked structure in FIG. 2B, relatively high parasitic resistance is caused by the rotational configuration. On the other hand, both the stacked structures in FIG. 2A and FIG. 2B have some problems, and cannot be directly applied to face-to-face stacked structures. Specifically, if the face-to-face chip-stacked structure needs to be further implemented, a manner is to manufacture two different types of chips through two sets of masks and respectively utilize the two different types of chips as a chip with an active surface facing upward and a chip with an active surface facing downward. In this manner, process complexity is relatively high, and costs are uncontrollable. Another manner is to manufacture an additional group of conductive vias and connect both groups of conductive vias to the same drive circuit in a memory chip. However, this results in complex internal tracks of the memory chip, which not only increases process complexity but also increases power consumption.

Therefore, the embodiments of the present disclosure provide a memory chip, a logic chip, a chip-stacked structure, and a memory. The chip-stacked structure not only has relatively low parasitic capacitance and parasitic resistance, but also implements a face-to-face stacking manner. In particular, the embodiments of the present disclosure further provide related mechanisms for performing global signal switching and redundancy repair in the structure.

The embodiments of the present disclosure are described below in detail with reference to the accompanying drawings.

Figure 3:
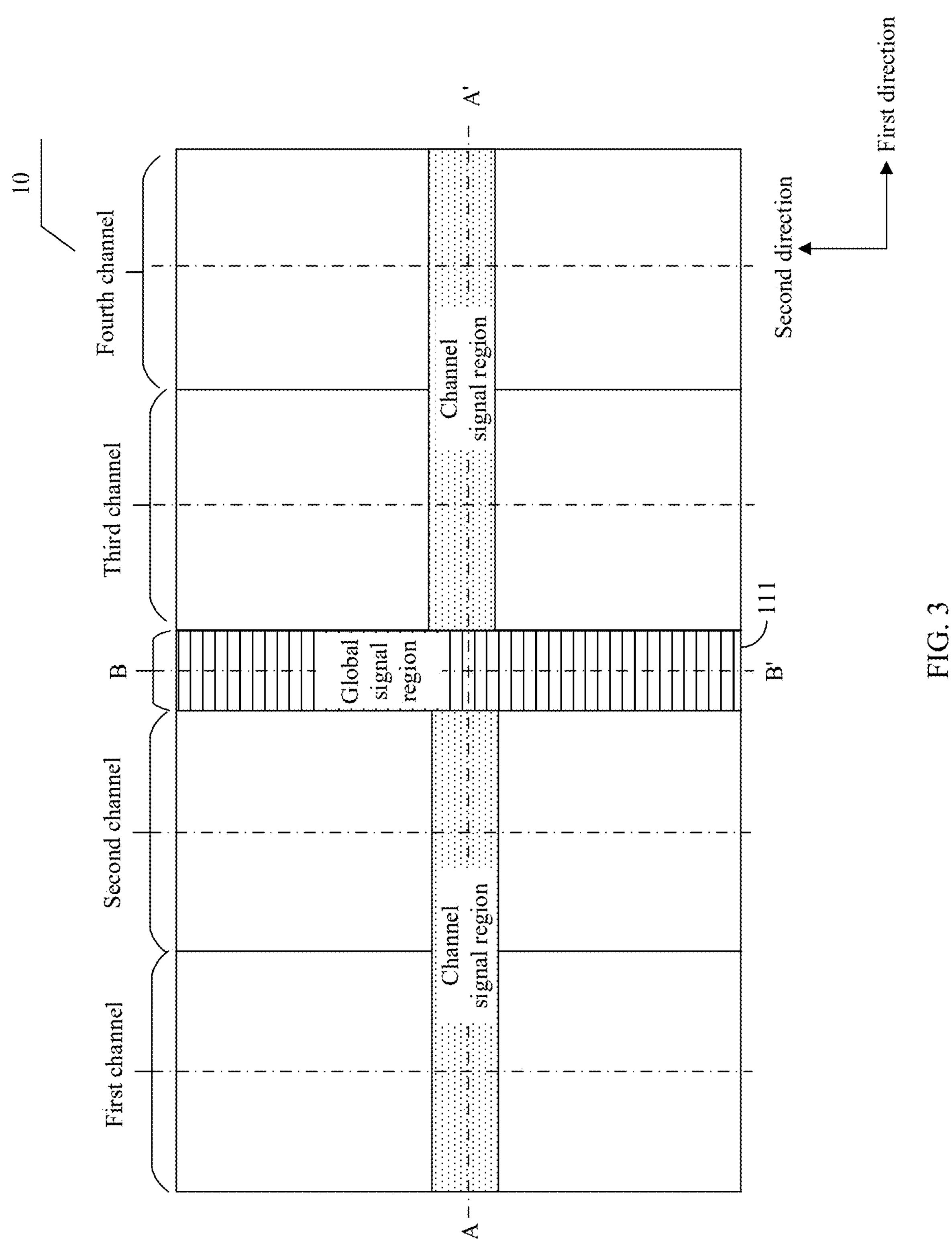
FIG. 3 is a schematic diagram of an active surface of a memory chip according to an embodiment of the present disclosure.

In an embodiment of the present disclosure, FIG. 3 is a schematic diagram of an active surface of a memory chip according to an embodiment of the present disclosure, which may be specifically understood as a schematic cross-sectional diagram of the active surface. As shown in FIG. 3, the memory chip 10 includes m channels (where m is a positive integer, and m=4 is taken as an example for illustration in FIG. 3). The m channels are sequentially arranged in a first direction. Each channel includes a first memory array region, a channel signal region, and a second memory array region that are sequentially distributed in a second direction, and a center of each channel signal region coincides with a center of a channel to which each channel signal region belongs.

It should be noted that in a chip manufacturing procedure, to distinguish between different channels of the chip, a positioning structure may be manufactured on a reference channel (e.g., a first channel) of the memory chip 10, so that during subsequent packaging, a location of the reference channel is identified through the positioning structure, and another channel is identified with reference to an orientation of the active surface of the chip.

FIG. 3 is shown by taking m=4 as an example. The following description is also provided by taking m=4 as an example. However, m may be any positive integer.

As shown in FIG. 3, a center point of the active surface of the memory chip 10 and an adjacent region of the center point are defined as a global signal region 111, and a center point of the global signal region 111 coincides with the center point of the active surface. The m channels are symmetric about the global signal region 111.

It should be noted that both the global signal region 111 and the channel signal region are penetrated by many conductive vias in a third direction, and the third direction is perpendicular to the active surface. Herein, the conductive via may be a through-silicon via (TSV), and is specifically a vertical interconnection structure that penetrates through a silicon wafer/chip, or in another embodiment, may be another conductive via that has a conductive function. This is not specifically limited. In addition, the conductive via may be in a form of the foregoing type 1 or in a form of the foregoing type 2.

For the global signal region 111, each conductive via is configured to transmit a global signal, and the global signal is shared by all regions of the corresponding memory chip 10. The global signal includes but is not limited to a reset signal, a power-on signal, a stacking identification signal SID/CID, a power supply-related signal Voltage Monitor, or a timing-related signal Timing Aligner. In some cases, the global signal region 111 may alternatively be a pad region. The global signal may be a test signal for design for test (DFT). A working status of an internal circuit of the chip and a transmission status of a related signal may be known through the global signal. In addition, because a pin pad of the test signal for DFT in the memory chip 10 is usually located at a middle location of the chip, a conductive via of the global signal such as the test signal for DFT is preferably located in a narrower region in the middle of the chip, that is, a location of the global signal region 111 shown in FIG. 3.

For the channel signal region, each conductive via is configured to transmit a channel signal, and a signal transmitted by each channel signal region is utilized only by the channel to which each channel signal region belongs. Conductive vias in all the channel signal regions are specific to the respective channel signal regions, and only a part (a corresponding channel) of the memory chip 10 utilizes the conductive via. A conductive via in the global signal region 111 located in the middle of the memory chip 10 is configured to test the entire memory chip 10, and a signal transmitted by the global signal region 111 is jointly utilized by the m channels of the memory chip 10.

Referring to FIG. 3, for the active surface of the memory chip 10, there is a first axis AA' and a second axis BB'. The first axis AA' and the second axis BB' are perpendicular to each other and intersect at the center point of the active surface, the first axis AA' is parallel to a first side edge of the memory chip 10, and the second axis BB' is parallel to a second side edge of the memory chip 10. In FIG. 3, the first axis AA' may extend in the first direction, and the second axis BB' may extend in the second direction. In another embodiment, the first axis AA' may extend in the second direction, and the second axis BB' may extend in the first direction. This is not specifically limited.

Figure 4:
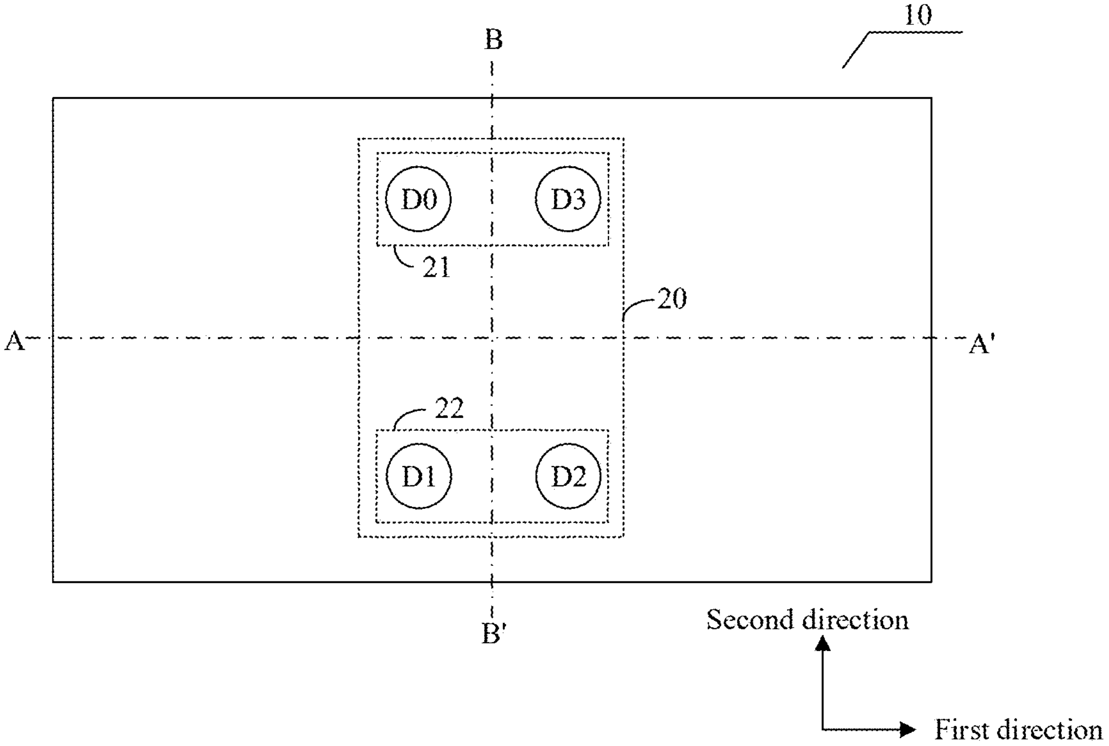
FIG. 4 is a schematic diagram 1 of structural composition of a memory chip according to an embodiment of the present disclosure.

Further, FIG. 4 is a schematic diagram 1 of structural composition of a memory chip according to an embodiment of the present disclosure. As shown in FIG. 4, in the memory chip 10, the global signal region is penetrated by multiple conductive via groups 20 (in FIG. 4, only one conductive via group 20 is shown, and the remaining conductive via groups 20 are omitted), and each conductive via group 20 includes a first dummy conductive via group 21 and a second dummy conductive via group 22. The first dummy conductive via group 21 includes a first conductive via D0 and a fourth conductive via D3, and the second dummy conductive via group 22 includes a second conductive via D1 and a third conductive via D2. The first dummy conductive via group 21 is configured to transmit the same first global signal, and the second dummy conductive via group 22 is configured to transmit the same second global signal.

In particular, FIG. 4 may be considered as a schematic cross-sectional diagram of the memory chip 10 along the active surface. Referring to FIG. 4, for the same conductive via group 20, the first conductive via D0 and the second conductive via D1 are symmetric about the first axis AA', the third conductive via D2 and the fourth conductive via D3 are symmetric about the first axis AA', and the first conductive via D0 and the fourth conductive via D3 are symmetric about the second axis BB'.

In this embodiment, the first conductive via D0 and the fourth conductive via D3 in the same first dummy conductive via group 21 or the second conductive via D1 and the third conductive via D2 in the same second dummy conductive via group 22 transmit signals that are exactly the same, that is, transmit signals with the same type and signal value, and further transmit the signals to an internal circuit of the memory chip 10. In addition, the first global signal transmitted by the first conductive via D0 and the fourth conductive via D3 is different from the second global signal transmitted by the second conductive via D1 and the third conductive via D2. Herein, the first global signal may be represented by A, the second global signal may be represented by B, and the first global signal and the second global signal need to appear in pairs. In addition, the first global signal and the second global signal include but are not limited to a reset signal, a power-on signal, a stacking identification signal SID/CID, a power supply-related signal Voltage Monitor, or a timing-related signal Timing Aligner. This is not specifically limited.

It should be noted that locations of the conductive via groups 20 in the global signal region are different. Specifically, a quantity and locations of conductive via groups 20 may be adjusted based on an actual situation. This is not limited. However, quantities of respective conductive vias in all the conductive via groups 20 need to be the same, and the foregoing symmetric distribution rule needs to be followed. An example in which the global signal region is penetrated by one conductive via group 20, the conductive via group 20 includes a first dummy conductive via group 21 and a second dummy conductive via group 22, and there are four conductive vias in the conductive via group 20 is utilized below for description.

It should be further noted that the conductive via mentioned above may be at least embodied as a through-silicon via, which is specifically a vertical interconnection structure that penetrates through a silicon wafer/memory chip, e.g., the type 1 in FIG. 1. Certainly, the conductive via may alternatively be of the type 2 in FIG. 1, and the conductive via implements signal transmission together with a contact structure. In another embodiment, another electrical connection structure may be selected as the conductive via.

It may be understood that a number sequence of conductive vias in each conductive via group 20 constitutes no limitation. In addition, for ease of illustration, the conductive via group, the first dummy conductive via group, and the second dummy conductive via group are not identified in subsequent accompanying drawings, and reference may be made to FIG. 4 for understanding.

Figure 5:
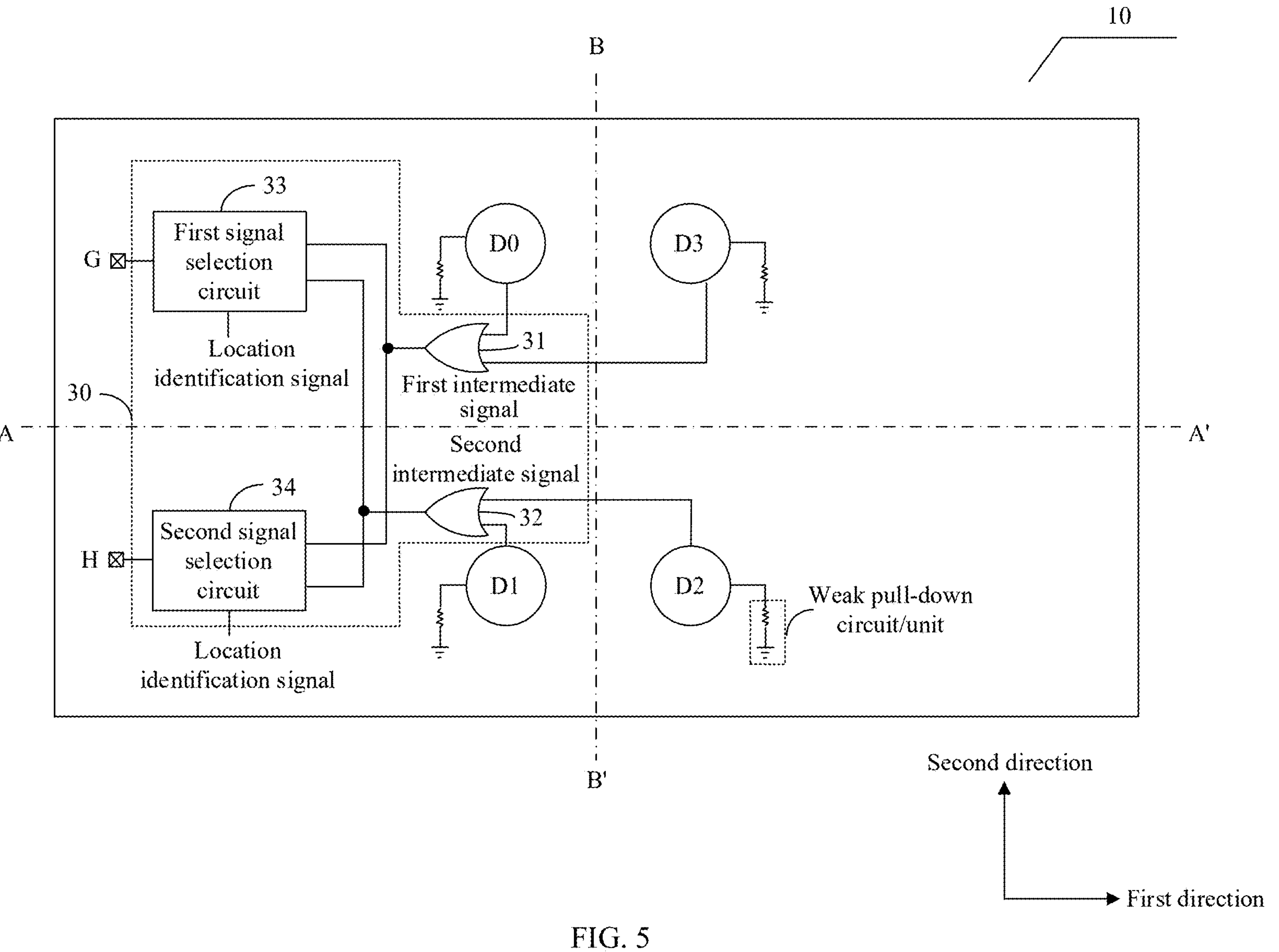
FIG. 5 is a schematic diagram 2 of structural composition of a memory chip according to an embodiment of the present disclosure.

Based on the memory chip 10 shown in FIG. 4, FIG. 5 is a schematic diagram 2 of structural composition of a memory chip according to an embodiment of the present disclosure. As shown in FIG. 5, in a possible embodiment, the memory chip 10 may further include multiple input selection circuits 30 (in FIG. 5, only one input selection circuit 30 is shown, and the remaining input selection circuits 30 are omitted). One side of each input selection circuit 30 is coupled to one conductive via group 20, and the other side of each input selection circuit 30 is coupled to one first signal input node and one second signal input node inside the memory chip 10.

The input selection circuit 30 is configured to: electrically connect a coupled first dummy conductive via group 21 to the coupled first signal input node, and electrically connect a coupled second dummy conductive via group 22 to the coupled second signal input node; or electrically connect a coupled first dummy conductive via group 21 to the coupled second signal input node, and electrically connect a coupled second dummy conductive via group 22 to the coupled first signal input node.

The first signal input node may be represented by G, and the second signal input node may be represented by H.

It should be noted that a quantity of the multiple conductive via groups 20 and a quantity of the multiple input selection circuits 30 may be the same or different. This is not specifically limited.

As shown in FIG. 5, in some embodiments, the input selection circuit 30 may include a first OR gate 31, a second OR gate 32, a first signal selection circuit 33, and a second signal selection circuit 34.

The first OR gate 31 is coupled to the first conductive via D0 and the fourth conductive via D3, and is configured to: perform an OR operation on a signal of the first conductive via D0 and a signal of the fourth conductive via D3, and output a first intermediate signal.

The second OR gate 32 is coupled to the second conductive via D1 and the third conductive via D2, and is configured to: perform an OR operation on a signal of the second conductive via D1 and a signal of the third conductive via D2, and output a second intermediate signal.

A first terminal of the first signal selection circuit 33 receives the first intermediate signal, and a second terminal of the first signal selection circuit 33 receives the second intermediate signal. The first signal selection circuit 33 is configured to: receive a location identification signal, and transmit one of the first intermediate signal and the second intermediate signal to the first signal input node based on the location identification signal.

A first terminal of the second signal selection circuit 34 receives the second intermediate signal, and a second terminal of the second signal selection circuit 34 receives the first intermediate signal. The second signal selection circuit 34 is configured to: receive the location identification signal, and transmit the other one of the first intermediate signal and the second intermediate signal to the second signal input node based on the location identification signal.

Specifically, the first OR gate 31 may be coupled to parts, on the active surface, of the first conductive via D0 and the fourth conductive via D3 in the same first dummy conductive via group 21, and the second OR gate 32 may be coupled to parts, on the active surface, of the second conductive via D1 and the third conductive via D2 in the same second dummy conductive via group 22. That is, for each memory chip 10, all conductive vias in some first dummy conductive via groups 21 in the memory chip 10 are coupled to first OR gates 31 corresponding to the some first dummy conductive via groups 21, the first OR gates 31 are respectively coupled to first signal selection circuits 33 and second signal selection circuits 34 corresponding to the first OR gates 31, all conductive vias in some second dummy conductive via groups 22 in the memory chip 10 are coupled to second OR gates 32 corresponding to the some second dummy conductive via groups 22, and the second OR gates 32 are respectively coupled to first signal selection circuits 33 and second signal selection circuits 34 corresponding to the second OR gates 32. When the location identification signal indicates that the first signal input node G is connected to the first dummy conductive via group 21, a global signal transmitted by the first dummy conductive via group 21 is transmitted to the first signal input node G through the first OR gate 31 and the first signal selection circuit 33 that are correspondingly coupled to the first dummy conductive via group 21, and a global signal transmitted by the second dummy conductive via group 22 is transmitted to the second signal input node H through the second OR gate 32 and the second signal selection circuit 34 that are correspondingly coupled to the second dummy conductive via group 22. When the location identification signal indicates that the first signal input node G is connected to the second dummy conductive via group 22, a global signal transmitted by the first dummy conductive via group 21 is transmitted to the second signal input node H through the first OR gate 31 and the second signal selection circuit 34 that are correspondingly coupled to the first dummy conductive via group 21, and a global signal transmitted by the second dummy conductive via group 22 is transmitted to the first signal input node G through the second OR gate 32 and the first signal selection circuit 33 that are correspondingly coupled to the second dummy conductive via group 22.

It should be noted that the first terminals and the second terminals of the first signal selection circuit 33 and the second signal selection circuit 34 are input terminals, and the first signal selection circuit 33 and the second signal selection circuit 34 may further have third terminals (that is, output terminals). The output terminal of the first signal selection circuit 33 is coupled to the first signal input node G, and the output terminal of the second signal selection circuit 34 is coupled to the second signal input node H.

It may be understood that the first global signal can be output provided that one of the first conductive via D0 and the fourth conductive via D3 is connected normally and transmits a signal, and the signal of the first conductive via D0 and the signal of the fourth conductive via D3 are mutually redundant. Similarly, the second global signal can be output provided that one of the second conductive via D1 and the third conductive via D2 is connected normally and transmits a signal, and the signal of the second conductive via D1 and the signal of the third conductive via D2 are mutually redundant.

In some embodiments, the first signal selection circuit 33 is configured to: transmit the first intermediate signal to the first signal input node G when the location identification signal is in a first state; or transmit the second intermediate signal to the first signal input node G when the location identification signal is in a second state.

The second signal selection circuit 34 is configured to: transmit the second intermediate signal to the second signal input node H when the location identification signal is in the first state; or transmit the first intermediate signal to the second signal input node H when the location identification signal is in the second state.

It should be noted that both a control terminal of the first signal selection circuit 33 and a control terminal of the second signal selection circuit 34 are configured to receive the location identification signal. For the location identification signal, the first state may be a low-level state (logic "0"), and the second state may be a high-level state (logic "1").

As shown in FIG. 5, in some embodiments, each conductive via is connected to a weak pull-down circuit. The weak pull-down circuit includes a resistor and a grounding terminal.

The weak pull-down circuit controls a level state of the conductive via to be a low level if the conductive via transmits no signal or is connected abnormally; or a level state of the conductive via depends on a transmitted signal if the conductive via is connected normally and transmits the signal.

It should be noted that the resistor in the weak pull-down circuit has a relatively large resistance value, to reduce current and power losses caused by a connection to the weak pull-down circuit. However, a specific value of the resistance value is not specifically limited. In addition, the weak pull-down circuit may be represented by weak pull "0".

In some embodiments, every four memory chips 10 are stacked into one stacked unit in the third direction, and when the memory chip 10 is located at a first-type location in the stacked unit, a low-order transmission region of the memory chip 10 and a high-order transmission region of the memory chip 10 at a second-type location are aligned in the third direction. Each memory chip 10 is divided into a low-order transmission region and a high-order transmission region by the first axis AA', or each memory chip 10 is divided into a low-order transmission region and a high-order transmission region by the second axis BB'.

Referring to FIG. 2A or FIG. 2B, a logic chip and multiple memory chips are stacked in the third direction to form a chip-stacked structure. In this embodiment of the present disclosure, in the chip-stacked structure, every four memory chips 10 form one stacked unit. In addition, each memory chip 10 has a chip location identification code CID and a stacking location identification code SID. The chip location identification code CID indicates a location number of the memory chip 10 in a stacked unit to which the memory chip 10 belongs. The stacking location identification code SID indicates a location number of the stacked unit to which the memory chip 10 belongs in a chip-stacked structure to which the stacked unit belongs.

A chip-stacked structure formed by stacking one logic chip and eight memory chips 10 (with every four memory chips 10 forming one stacked unit, for a total of two stacked units) is taken as an example. In this case, the chip location identification code CID includes 2 bits of sub-signals CID[1] and CID[0], which are denoted as CID[1:0] (that is, a combination of CID[1] and CID[0]), and the chip location identification code CID[1:0] is obtained by decoding a chip location identification signal group $CID_0[3:0]$; and the stacking location identification code SID includes 2 bits of sub-signals SID[1] and SID[0], which are denoted as SID [1:0] (that is, a combination of SID[1] and SID[0]). In particular, in a normal working phase of the memory chip 10, numbering is performed from a side of the logic chip (that is, from bottom to top). In this case, the chip location identification code CID[1:0] and the stacking location identification code SID[1:0] of each chip are shown in Table 1. In an initialization phase of the memory chip 10, numbering is performed from a side away from the logic chip (that is, from top to bottom). This case is not currently shown, but may be correspondingly understood.

In particular, in this embodiment of the present disclosure, different memory chips 10 are placed at different locations in the chip-stacked structure. For ease of description, an active surface (a plane on which a first direction and a second direction are located) of each memory chip 10 is divided into a low-order transmission region and a high-order transmission region (in the present disclosure, an example in which the low-order transmission region and the high-order transmission region are obtained through division in the first direction is utilized for display). Placement locations of the memory chips 10 in the chip-stacked structure in the present disclosure may be different as follows: The high-order transmission region is located on a side to which an arrow of the second direction points or the low-order transmission region is located on a side to which an arrow of the second direction points. Herein, reference may be further made to descriptions and accompanying drawings of the chip-stacked structure.

TABLE 1

| | $CID_0[3:0]$ | CID[1:0] | SID[1:0] |
|---|---|---|---|
| Memory chip 107 | 1000 | 11 | 01 |
| Memory chip 106 | 0100 | 10 | 01 |
| Memory chip 105 | 0010 | 01 | 01 |
| Memory chip 104 | 0001 | 00 | 01 |
| Memory chip 103 | 1000 | 11 | 00 |
| Memory chip 102 | 0100 | 10 | 00 |
| Memory chip 101 | 0010 | 01 | 00 |
| Memory chip 100 | 0001 | 00 | 00 |
| Logic chip | 0001 | 00 | 00 |

Further, the memory chip 10 further includes a decoding circuit, coupled to the first signal selection circuit 33 and the second signal selection circuit 34 and configured to: receive a chip location identification code, the chip location identification code including a high-order location parameter and a low-order location parameter; and output the location identification signal in the first state if the chip location identification code indicates that the memory chip 10 is located at the first-type location; or output the location identification signal in the second state if the chip location identification code indicates that the memory chip 10 is located at the second-type location.

It may be understood that because the chip location identification code CID[1:0] is obtained by decoding the chip location identification signal group $CID_0[3:0]$, when the chip location identification signal group $CID_0[3:0]$ indicates that the memory chip 10 is located at the first-type location, the chip location identification code CID[1:0] also indicates that the memory chip 10 is located at the first-type location. Similarly, when the chip location identification signal group $CID_0[3:0]$ indicates that the memory chip 10 is located at the second-type location, the chip location identification code CID[1:0] also indicates that the memory chip 10 is located at the second-type location. The chip location identification signal group $CID_0[3:0]$ indicates a location of the memory chip 10 in a stacked unit to which the memory chip 10 belongs.

In a possible embodiment, for each stacked unit, the first memory chip 10 and the fourth memory chip 10 are located at the first-type location, and the second memory chip 10 and the third memory chip 10 are located at the second-type location.

Figure 6:
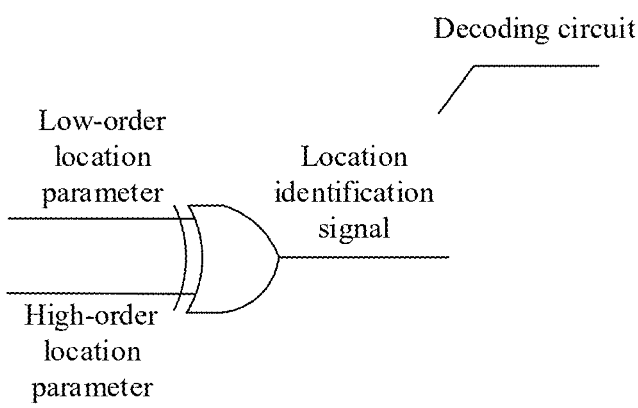
FIG. 6 is a schematic diagram of structural composition of a decoding circuit according to an embodiment of the present disclosure.

As shown in FIG. 6, the decoding circuit is a two-input XOR gate. A first input terminal of the two-input XOR gate is configured to receive the low-order location parameter, a second input terminal of the two-input XOR gate is configured to receive the high-order location parameter, and an output terminal of the two-input XOR gate is configured to output the location identification signal.

It should be noted that the chip location identification code CID includes the 2 bits of sub-signals CID[1] and CID[0]. Herein, the low-order location parameter is CID[0], and the high-order location parameter is CID[1]. For example, in Table 1, for the first memory chip 100, when CID[1:0]=00, an XOR result is 0, and the location identification signal is in the first state; for the second memory chip 101, when CID[1:0]=01, an XOR result is 1, and the location identification signal is in the second state; for the third memory chip 102, when CID[1:0]=10, an XOR result is 1, and the location identification signal is in the second state; and for the fourth memory chip 103, when CID[1:0]=11, an XOR result is 0, and the location identification signal is in the first state.

In another possible embodiment, for each stacked unit, the first memory chip 10 and the second memory chip 10 are located at the first-type location, and the third memory chip 10 and the fourth memory chip 10 are located at the second-type location; and the decoding circuit determines the high-order location parameter as the location identification signal.

For example, in Table 1, for the first memory chip 100, when CID[1:0]=00, the high-order location parameter CID [1] is equal to 0, and the location identification signal is in the first state; for the second memory chip 101, when CID[1:0]=01, the high-order location parameter CID[1] is equal to 0, and the location identification signal is in the first state; for the third memory chip 102, when CID[1:0]=10, the high-order location parameter CID[1] is equal to 1, and the location identification signal is in the second state; and for the fourth memory chip 103, when CID[1:0]=11, the high-order location parameter CID[1] is equal to 1, and the location identification signal is in the second state.

In this case, the decoding circuit may be a buffer or a driver. This is not specifically limited.

Figure 7:
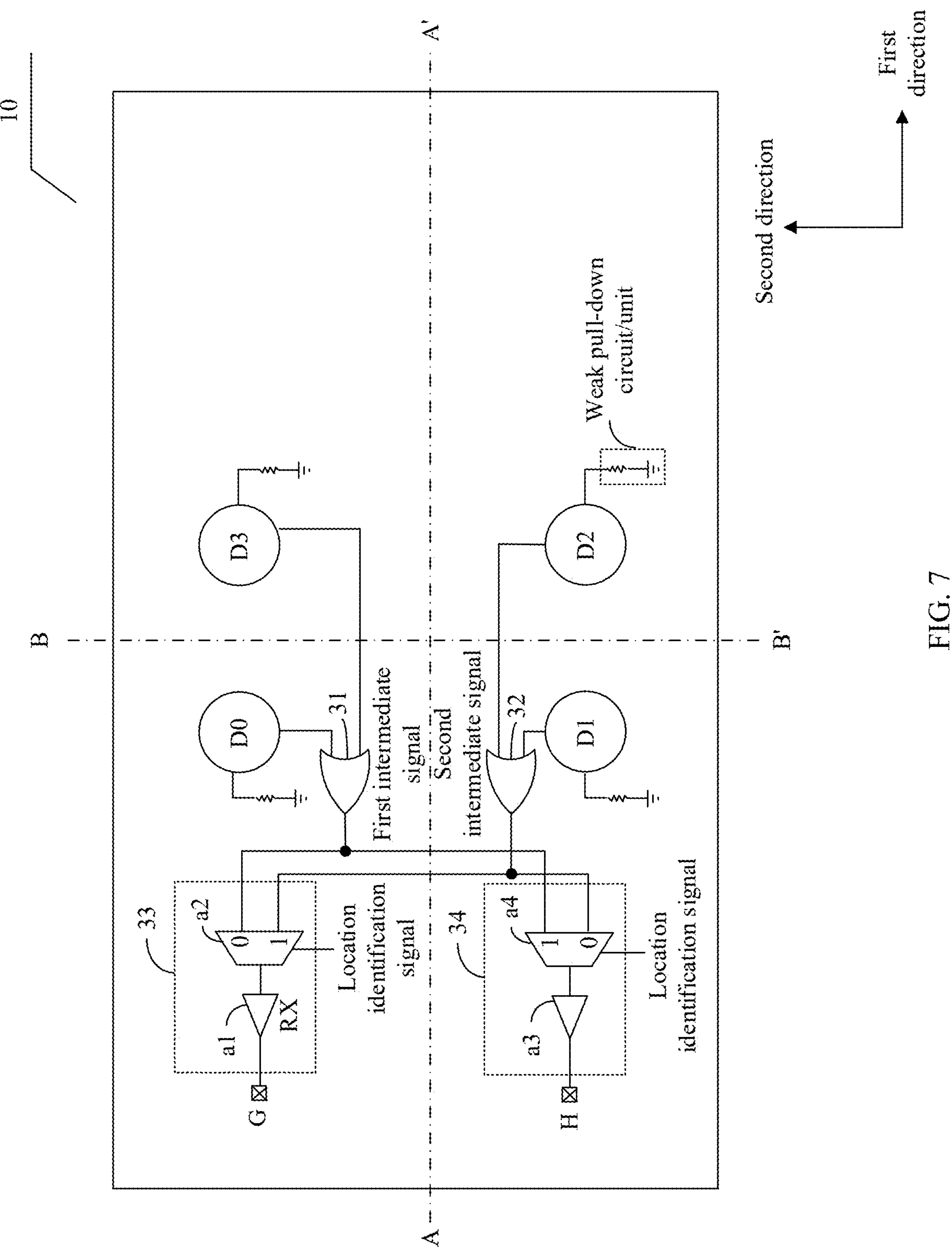
FIG. 7 is a schematic diagram 3 of structural composition of a memory chip according to an embodiment of the present disclosure.

For the first signal selection circuit 33 and the second signal selection circuit 34, FIG. 7 is a schematic diagram 3 of structural composition of a memory chip according to an embodiment of the present disclosure. As shown in FIG. 7, in some embodiments, the first signal selection circuit 33 may include a first driver a1 and a first data selector a2, and the second signal selection circuit 34 may include a second driver a3 and a second data selector a4.

A first terminal of the first data selector a2 receives the first intermediate signal, a second terminal of the first data selector a2 receives the second intermediate signal, a third terminal of the first data selector a2 is coupled to a first terminal of the first driver a1, and a second terminal of the first driver a1 is coupled to the first signal input node.

A first terminal of the second data selector a4 receives the second intermediate signal, a second terminal of the second data selector a4 receives the first intermediate signal, a third terminal of the second data selector a4 is coupled to a first terminal of the second driver a3, and a second terminal of the second driver a3 is coupled to the second signal input node.

It should be noted that for each of the first data selector a2 and the second data selector a4, the first terminal and the second terminal are input terminals, and the third terminal is an output terminal. The first terminal is a logic "0" terminal, and the second terminal is a logic "1" terminal.

It should be further noted that as shown in FIG. 7, the first driver a1 and the second driver a3 are specifically input drivers, which may also be referred to as input drive branches (Receive, RX).

It may be understood that for the conductive via group 20, the first driver a1 is coupled to the first data selector a2 corresponding to the first driver a1, so that one of the first intermediate signal or the second intermediate signal selected and output by the first data selector a2 is input to the inside of the memory chip 10 through the first driver a1 correspondingly coupled to the first data selector a2; and the second driver a3 is coupled to the second data selector a4 corresponding to the second driver a3, so that the other one of the first intermediate signal or the second intermediate signal selected and output by the second data selector a4 is input to the inside of the memory chip 10 through the second driver a3 correspondingly coupled to the second data selector a4.

Figure 8:
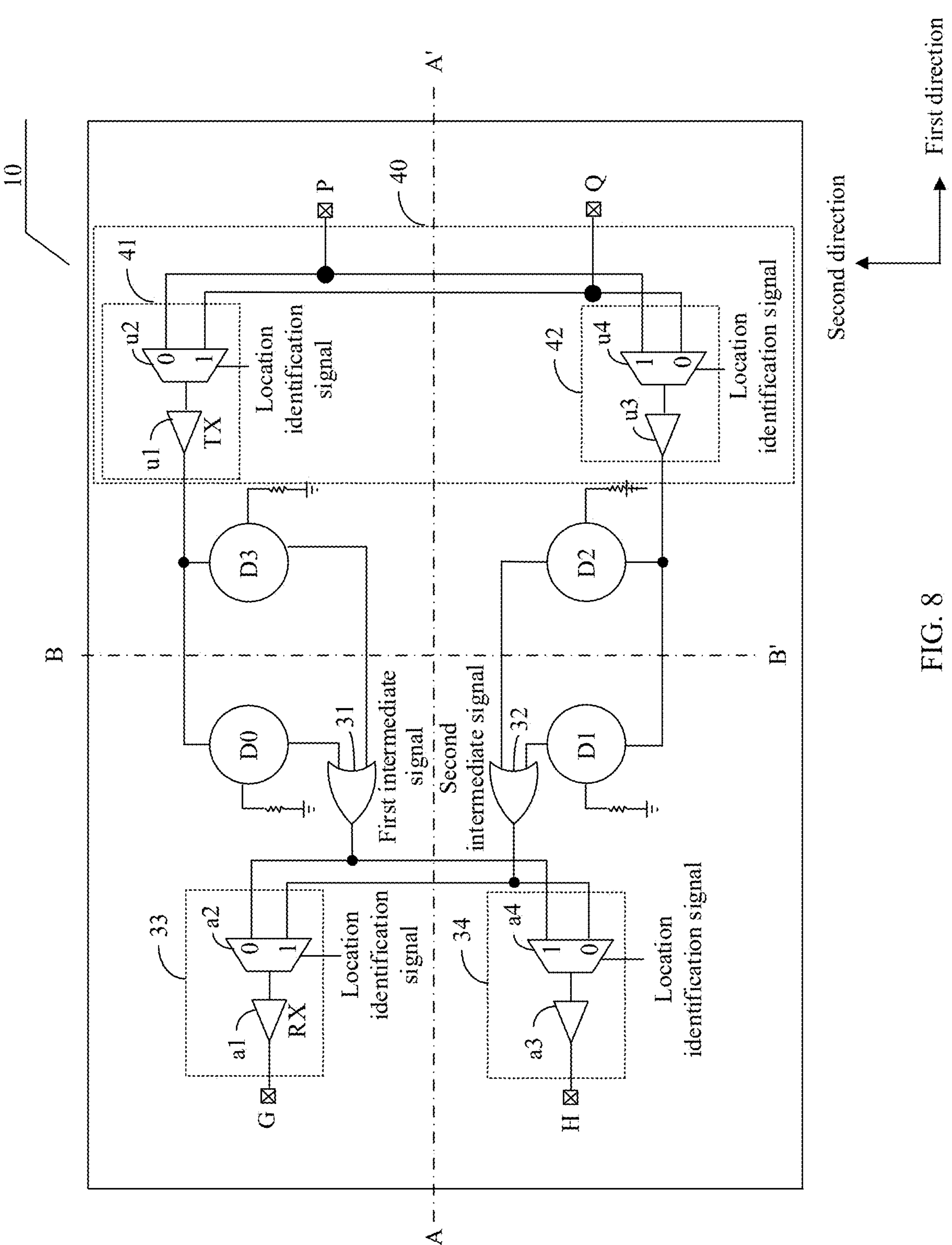
FIG. 8 is a schematic diagram 4 of structural composition of a memory chip according to an embodiment of the present disclosure.

Based on FIG. 7, FIG. 8 is a schematic diagram 4 of structural composition of a memory chip according to an embodiment of the present disclosure. As shown in FIG. 8, in another possible embodiment, the memory chip 10 may further include multiple output selection circuits 40 (in FIG. 8, only one output selection circuit 40 is shown, and the remaining output selection circuits 40 are omitted). One side of each output selection circuit 40 is coupled to one first signal output node and one second signal output node inside the memory chip 10, and the other side of each output selection circuit 40 is coupled to one conductive via group 20.

The output selection circuit 40 is configured to: electrically connect the coupled first signal output node to a coupled first dummy conductive via group 21, and electrically connect the coupled second signal output node to a coupled second dummy conductive via group 22; or electrically connect the coupled first signal output node to a coupled second dummy conductive via group 22, and electrically connect the coupled second signal output node to a coupled first dummy conductive via group 21.

The first signal output node may be represented by P, and the second signal output node may be represented by Q.

It should be noted that the quantity of the multiple conductive via groups 20 and a quantity of the multiple output selection circuits 40 may be the same or different. This is not specifically limited.

It should be further noted that the memory chip 10 may include only the output selection circuit 40, or may include the input selection circuit 30 and the output selection circuit 40. This is not specifically limited. For example, the input selection circuit 30 and the output selection circuit 40 are included in FIG. 8 (the reference numeral of the input selection circuit 30 is not shown, and is understood based on FIG. 5).

In some embodiments, as shown in FIG. 8, the output selection circuit 40 may include a third signal selection circuit 41 and a fourth signal selection circuit 42.

A first terminal of the third signal selection circuit 41 is coupled to the first signal output node, a second terminal of the third signal selection circuit 41 is coupled to the second signal output node, and a third terminal of the third signal selection circuit 41 is coupled to the first dummy conductive via group 21. The third signal selection circuit 41 is configured to: receive a location identification signal, and electrically connect one of the first signal output node and the second signal output node to the first dummy conductive via group 21 based on the location identification signal.

A first terminal of the fourth signal selection circuit 42 is coupled to the second signal output node, a second terminal of the fourth signal selection circuit 42 is coupled to the first signal output node, and a third terminal of the fourth signal selection circuit 42 is coupled to the second dummy conductive via group 22. The fourth signal selection circuit 42 is configured to: receive the location identification signal, and electrically connect the other one of the first signal output node and the second signal output node to the second dummy conductive via group 22 based on the location identification signal.

Both a control terminal of the third signal selection circuit 41 and a control terminal of the fourth signal selection circuit 42 are configured to receive the location identification signal. In some embodiments, the third signal selection circuit 41 is configured to: electrically connect the first signal output node P to the first dummy conductive via group 21 when the location identification signal is in the first state (logic "0"); or electrically connect the second signal output node Q to the first dummy conductive via group 21 when the location identification signal is in the second state (logic "1"); and the fourth signal selection circuit 42 is configured to: electrically connect the second signal output node Q to the second dummy conductive via group 22 when the location identification signal is in the first state; or electrically connect the first signal output node P to the second dummy conductive via group 22 when the location identification signal is in the second state.

Further, as shown in FIG. 8, in some embodiments, the third signal selection circuit 41 includes a third driver u1 and a third data selector u2, and the fourth signal selection circuit 42 includes a fourth driver u3 and a fourth data selector u4.

A first terminal of the third data selector u2 is coupled to the first signal output node, a second terminal of the third data selector u2 is coupled to the second signal output node, a third terminal of the third data selector u2 is coupled to a first terminal of the third driver u1, and a second terminal of the third driver u1 is coupled to the first dummy conductive via group 21.

A first terminal of the fourth data selector u4 is coupled to the second signal output node, a second terminal of the fourth data selector u4 is coupled to the first signal output node, a third terminal of the fourth data selector u4 is coupled to a first terminal of the fourth driver u3, and a second terminal of the fourth driver u3 is coupled to the second dummy conductive via group 22.

It should be noted that for each of the third data selector u2 and the fourth data selector u4, the first terminal and the second terminal are input terminals, and the third terminal is an output terminal. The first terminal is a logic "0" terminal, and the second terminal is a logic "1" terminal.

It should be further noted that as shown in FIG. 8, the third driver u1 and the fourth driver u3 are specifically output drivers, which may also be referred to as output drive branches (Transmit, TX). The third driver u1 and the fourth driver u3 output a global signal generated by the internal circuit of the memory chip 10 to the corresponding coupled first dummy conductive via group 21 or second dummy conductive via group 22.

It may be understood that for some first dummy conductive via groups 21, the third driver u1 is coupled to the third data selector u2 corresponding to the third driver u1, so that one of the first signal output node P or the second signal output node Q selected by the third data selector u2 is coupled to the corresponding first dummy conductive via group 21 through the third driver u1 correspondingly coupled to the third data selector u2; and for some second dummy conductive via groups 22, the fourth driver u3 is coupled to the fourth data selector u4 corresponding to the fourth driver u3, so that the other one of the first signal output node P or the second signal output node Q selected by the fourth data selector u4 is coupled to the corresponding second dummy conductive via group 22 through the fourth driver u3 correspondingly coupled to the fourth data selector u4.

Figure 9:
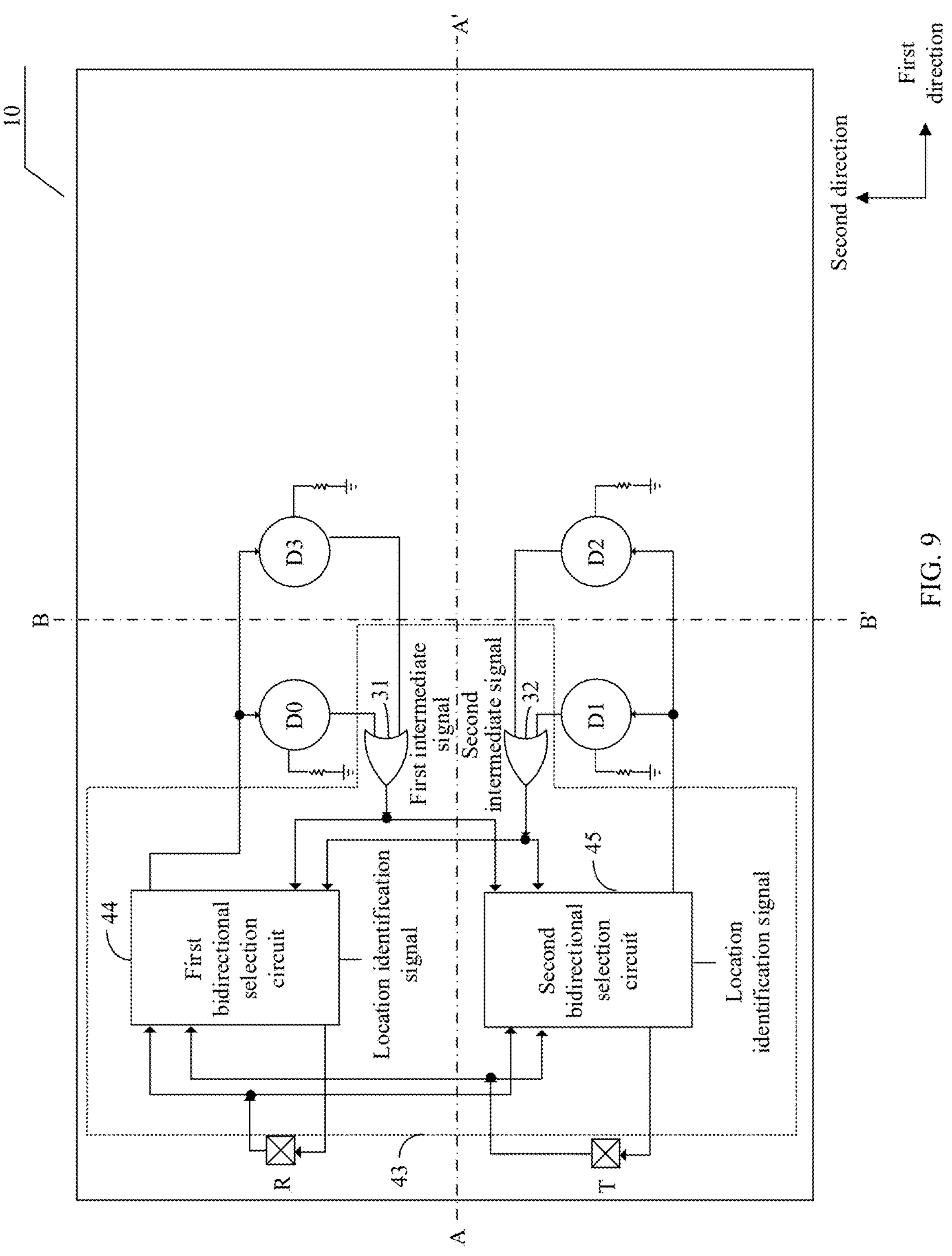
FIG. 9 is a schematic diagram 5 of structural composition of a memory chip according to an embodiment of the present disclosure.

FIG. 9 is a schematic diagram 5 of structural composition of a memory chip according to an embodiment of the present disclosure. As shown in FIG. 9, in some embodiments, the memory chip 10 may further include multiple bidirectional selection circuits 43. One side of each bidirectional selection circuit 43 is coupled to one conductive via group 20, and the other side of each bidirectional selection circuit 43 is coupled to one first bidirectional signal node and one second bidirectional signal node inside the memory chip 10.

The bidirectional selection circuit 43 is configured to: electrically connect a coupled first dummy conductive via group 21 to the coupled first bidirectional signal node, and electrically connect a coupled second dummy conductive via group 22 to the coupled second bidirectional signal node; or electrically connect a coupled first dummy conductive via group 21 to the coupled second bidirectional signal node, and electrically connect a coupled second dummy conductive via group 22 to the coupled first bidirectional signal node.

The bidirectional selection circuit 43 is further configured to: receive an input enable signal and an output enable signal; and transmit, through driving, a signal received from the first dummy conductive via group 21 to a bidirectional signal node coupled to the bidirectional selection circuit 43, and transmit, through driving, a signal received from the second dummy conductive via group 22 to the bidirectional signal node coupled to the bidirectional selection circuit 43, when the input enable signal is in an enabled state; or transmit, through driving, a signal received from the first bidirectional signal node to a dummy conductive via group coupled to the bidirectional selection circuit 43, and transmit, through driving, a signal received from the second bidirectional signal node to the dummy conductive via group coupled to the bidirectional selection circuit 43, when the output enable signal is in an enabled state.

The first bidirectional signal node may be represented by R, and the second bidirectional signal node may be represented by T.

Herein, the quantity of the multiple conductive via groups 20 and a quantity of the multiple bidirectional selection circuits 43 may be the same or different. This is not specifically limited.

It should be noted that, only one of the input enable signal and the output enable signal is in the enabled state at the same time.

It should be further noted that when the input enable signal is in the enabled state, the signal received from the first dummy conductive via group 21 may be transmitted, through driving, to the first bidirectional signal node R or the second bidirectional signal node T coupled to the bidirectional selection circuit 43, and the signal received from the second dummy conductive via group 22 is transmitted, through driving, to the second bidirectional signal node T or the first bidirectional signal node R coupled to the bidirectional selection circuit 43. When the output enable signal is in the enabled state, the signal received from the first bidirectional signal node R may be transmitted, through driving, to the first dummy conductive via group 21 or the second redundant via group 22 coupled to the bidirectional selection circuit 43, and the signal received from the second bidirectional signal node T is transmitted, through driving, to the second redundant via group 22 or the first dummy conductive via group 21 coupled to the bidirectional selection circuit 43.

Further, as shown in FIG. 9, in some embodiments, the bidirectional selection circuit 43 may further include a first OR gate 31, a second OR gate 32, a first bidirectional selection circuit 44, and a second bidirectional selection circuit 45.

The first OR gate 31 is coupled to the first conductive via D0 and the fourth conductive via D3, and is configured to: perform an OR operation on a signal of the first conductive via D0 and a signal of the fourth conductive via D3, and output a first intermediate signal.

The second OR gate 32 is coupled to the second conductive via D1 and the third conductive via D2, and is configured to: perform an OR operation on a signal of the second conductive via D1 and a signal of the third conductive via D2, and output a second intermediate signal.

The first bidirectional selection circuit 44 is configured to: receive a location identification signal, and transmit one of the first intermediate signal and the second intermediate signal to the first bidirectional signal node based on the location identification signal, when the input enable signal is in the enabled state.

The second bidirectional selection circuit 45 is configured to: receive the location identification signal, and transmit the other one of the first intermediate signal and the second intermediate signal to the second bidirectional signal node based on the location identification signal, when the input enable signal is in the enabled state.

The first bidirectional selection circuit 44 is further configured to: receive the location identification signal, and transmit, to one of the first dummy conductive via group 21 and the second dummy conductive via group 22 based on the location identification signal, the signal output by the first bidirectional signal node, when the output enable signal is in the enabled state.

The second bidirectional selection circuit 45 is further configured to: receive the location identification signal, and transmit, to the other one of the first dummy conductive via group 21 and the second dummy conductive via group 22 based on the location identification signal, the signal output by the second bidirectional signal node, when the output enable signal is in the enabled state.

Enable terminals of the first bidirectional selection circuit 44 and the second bidirectional selection circuit 45 are configured to receive an input enable control signal and an output enable control signal (the enable terminal is not shown in FIG. 9).

In some embodiments, each conductive via in the memory chip 10 may be prepared through any one or more of a via-first process, a via-middle process, a via-last process, and a backside via-last process, and different conductive vias in the same memory chip 10 are electrically isolated from each other.

The via-first process is a via process method in which a via structure is first manufactured before a structure of a device such as a metal-oxide-semiconductor field-effect transistor (MOSFET or MOS transistor for short) device is manufactured. The via-middle process is a via process in which a via structure formed in a manufacturing procedure of a process flow is usually manufactured after a device is formed and before a stacked layer is manufactured. The via-last process is a manufacturing process in which a via is formed from the front of a wafer after processing of a back end of line (BEOL) process is completed. The backside via-last process is a manufacturing process in which a via structure is manufactured from the back of a wafer after processing of a BEOL process is completed. That is, the via-first process may mean manufacturing a via first, and then manufacturing a circuit, e.g., the conductive via of the type 1 in FIG. 1; the via-middle process may mean manufacturing a circuit and some metal layers first, then manufacturing a via, and finally manufacturing the remaining vias, e.g., the conductive via of the type 2 in FIG. 1; and the via-last process and the backside via-last process may mean manufacturing a circuit and a metal layer first, and finally manufacturing a via, e.g., the conductive via of the type 2 in FIG. 1.

This embodiment of the present disclosure provides a memory chip. Conductive vias in the memory chip have special symmetry, and can be directly applied to a stacked structure formed in any manner such as face-to-face/back-to-back/face-to-back, and no two sets of masks or two sets of conductive vias are required. Compared with the memory chip in FIG. 1, the memory chip can reduce parasitic capacitance, reduce a circuit area, and lower chip manufacturing costs. When a stacked structure is subsequently formed, the memory chip 10 can further reduce parasitic resistance compared with the memory chips in FIG. 2A and FIG. 2B (for a specific reason, reference is made to subsequent descriptions).

Figure 10:
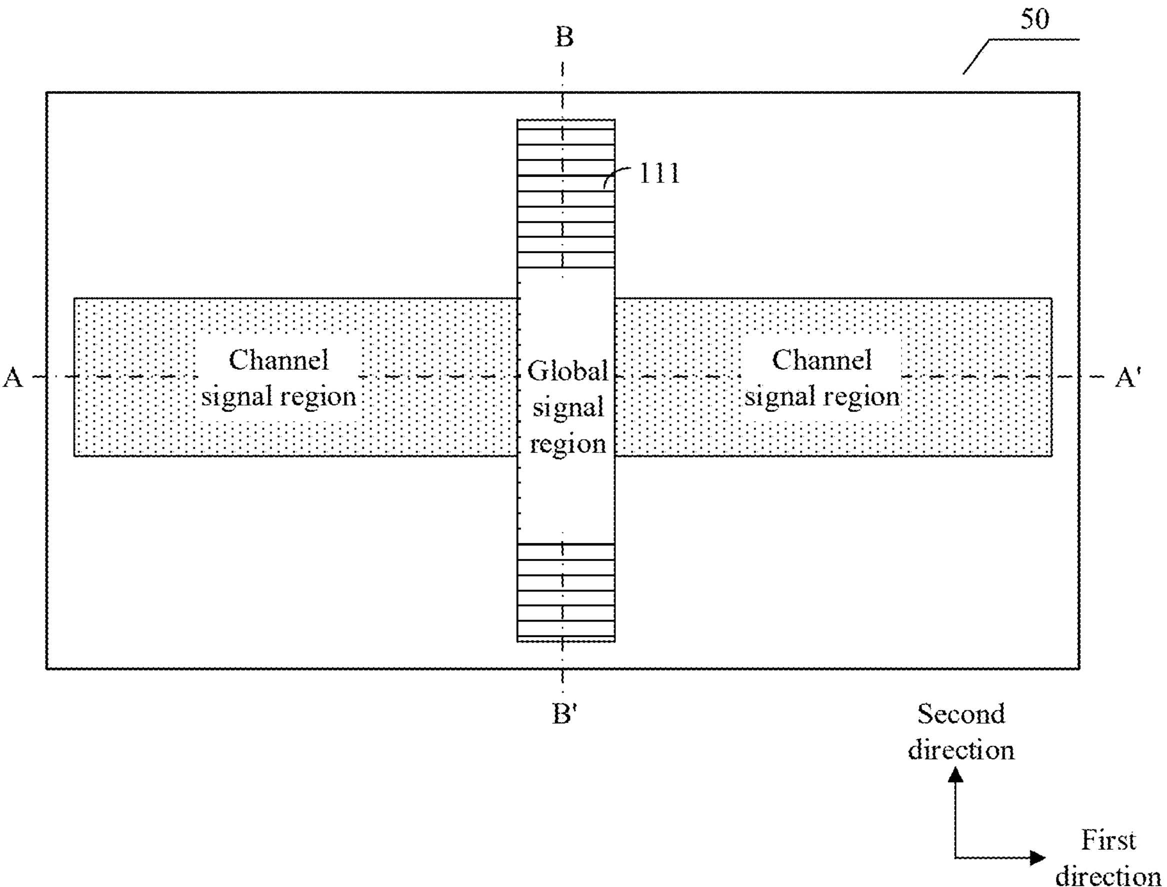
FIG. 10 is a schematic diagram of an active surface of a logic chip according to an embodiment of the present disclosure.

In another embodiment of the present disclosure, FIG. 10 is a schematic diagram of an active surface of a logic chip according to an embodiment of the present disclosure. As shown in FIG. 10, a center point of the active surface of the logic chip 50 and an adjacent signal region of the center point are defined as a global signal region 111, a center point of the global signal region 111 coincides with the center point of the active surface, and channel signal regions are distributed on two sides of the global signal region 111.

Both the global signal region 111 and the channel signal region are penetrated by many conductive vias in a third direction, and the third direction is perpendicular to the active surface. In addition, because a pad in the logic chip 50 is usually located at a middle location of the chip, a conductive via of a global signal such as a test signal for DFT is preferably located in a narrower region in the middle of the chip, that is, a location of the global signal region 111 shown in FIG. 10.

In addition, areas of the logic chip 50 and the memory chip 10 may be the same or different. This is not specifically limited. However, both global signal regions in the two chips are located at middle locations of the respective chips, and areas of the two global signal regions are the same.

Referring to FIG. 10, for the active surface of the logic chip 50, there is a first axis AA' and a second axis BB'. The first axis AA' and the second axis BB' are perpendicular to each other and intersect at the center point of the active surface, the first axis AA' is parallel to a first side edge of the logic chip 50, and the second axis BB' is parallel to a second side edge of the logic chip 50. In FIG. 10, the first axis AA' extends in a first direction, and the second axis BB' extends in a second direction. However, this is merely an example and constitutes no specific limitation.

Figure 11:
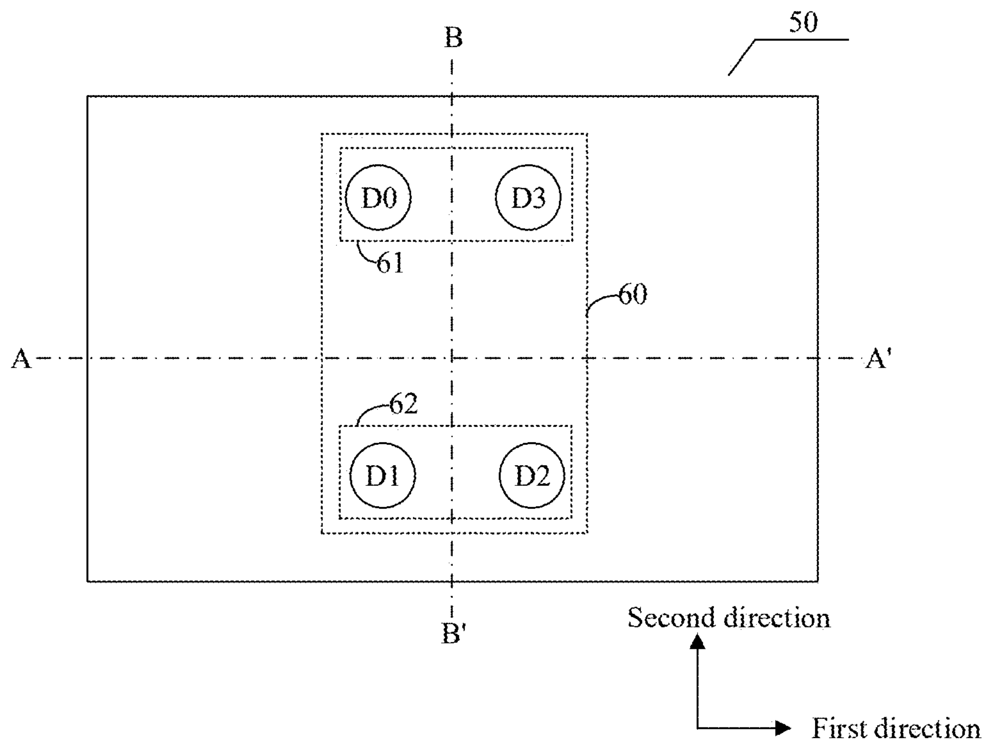
FIG. 11 is a schematic diagram 1 of structural composition of a logic chip according to an embodiment of the present disclosure.

Further, FIG. 11 is a schematic diagram 1 of structural composition of a logic chip according to an embodiment of the present disclosure. As shown in FIG. 11, in the logic chip 50, the global signal region is penetrated by multiple conductive via groups 60 (in FIG. 11, only one conductive via group 60 is shown, and the remaining conductive via groups 60 are omitted), and each conductive via group 60 includes a first dummy conductive via group 61 and a second dummy conductive via group 62. The first dummy conductive via group 61 includes a first conductive via D0 and a fourth conductive via D3, and the second dummy conductive via group 62 includes a second conductive via D1 and a third conductive via D2. The first dummy conductive via group 61 is configured to transmit the same first global signal, and the second dummy conductive via group 62 is configured to transmit the same second global signal.

In particular, FIG. 11 may be considered as a schematic cross-sectional diagram of the logic chip 50 along the active surface. Referring to FIG. 11, for the same conductive via group 60, the first conductive via D0 and the second conductive via D1 are symmetric about the first axis AA', the third conductive via D2 and the fourth conductive via D3 are symmetric about the first axis AA', and the first conductive via D0 and the fourth conductive via D3 are symmetric about the second axis BB'.

In this embodiment, the first conductive via D0 and the fourth conductive via D3 in the same first dummy conductive via group 61 or the second conductive via D1 and the third conductive via D2 in the same second dummy conductive via group 62 transmit signals that are exactly the same, that is, transmit signals with the same type and signal value, and further transmit the signals to different memory chips.

It should be noted that locations of the conductive via groups 60 in the global signal region are different. Specifically, a quantity and locations of conductive via groups 60 may be adjusted based on an actual situation. This is not limited. However, quantities of respective conductive vias in all the conductive via groups 60 need to be the same, and the foregoing symmetric distribution rule needs to be followed. An example in which the global signal region is penetrated by one conductive via group 60, the conductive via group 60 includes a first dummy conductive via group 61 and a second dummy conductive via group 62, and there are four conductive vias in the conductive via group 60 is utilized below for description.

It may be understood that a number sequence of conductive vias in each conductive via group 60 constitutes no limitation.

Figure 12:
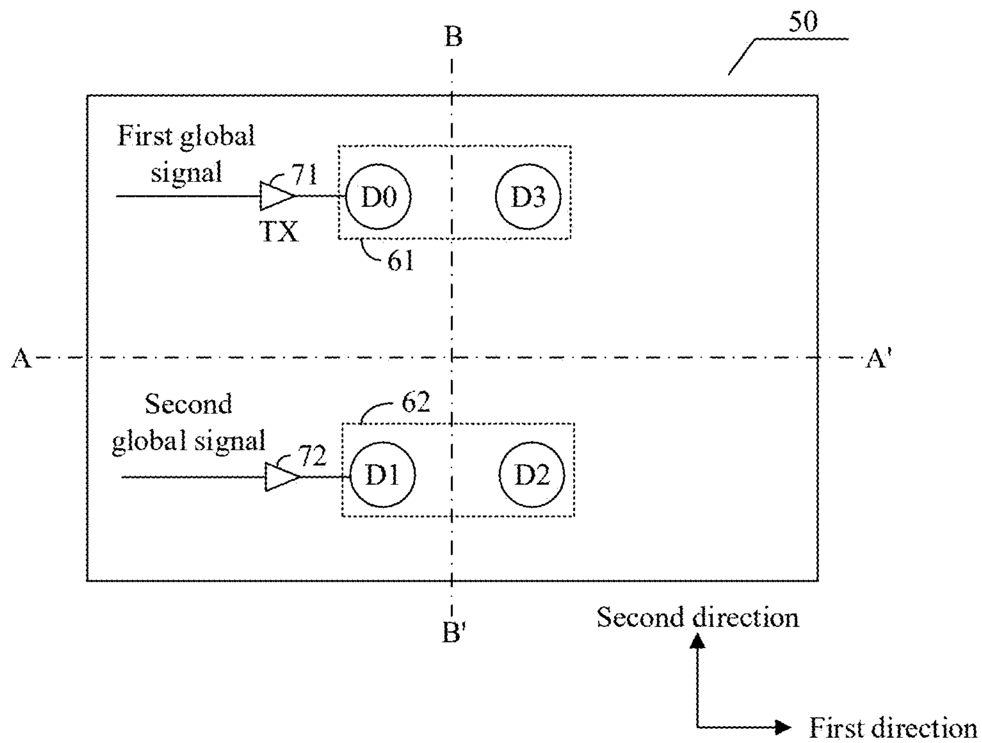
FIG. 12 is a schematic diagram 2 of structural composition of a logic chip according to an embodiment of the present disclosure.

FIG. 12 is a schematic diagram 2 of structural composition of a logic chip according to an embodiment of the present disclosure. As shown in FIG. 12, in a possible embodiment, the logic chip 50 may further include multiple first output drive circuits 71 and multiple second output drive circuits 72 (in FIG. 12, only one first output drive circuit 71 and one second output drive circuit 72 are shown, and the remaining first output drive circuits 71 and second output drive circuits 72 are omitted).

One first output drive circuit 71 is coupled to all conductive vias in one first dummy conductive via group 61, and one second output drive circuit 72 is coupled to all conductive vias in one second dummy conductive via group 62.

The first output drive circuit 71 is configured to send the first global signal generated inside the logic chip 50 to all corresponding coupled conductive vias.

The second output drive circuit 72 is configured to send the second global signal generated inside the logic chip 50 to all corresponding coupled conductive vias.

The first output drive circuit 71 may be coupled to parts, on the active surface, of a first conductive via D0 and a fourth conductive via D3 in a corresponding first dummy conductive via group 61, and the second output drive circuit 72 may be coupled to parts, on the active surface, of a second conductive via D1 and a third conductive via D2 in a corresponding second dummy conductive via group 62. That is, for the first dummy conductive via group 61, the first conductive via D0 and the fourth conductive via D3 are connected to the same first output drive circuit 71, and a first global signal transmitted by each conductive via is output from the inside of the logic chip 50, and is sent to all conductive vias correspondingly coupled to the first output drive circuit 71; and the second conductive via D1 and the third conductive via D2 are connected to the same second output drive circuit 72, and a second global signal transmitted by each conductive via is output from the inside of the logic chip 50, and is sent to all conductive vias correspondingly coupled to the second output drive circuit 72.

Figure 13:
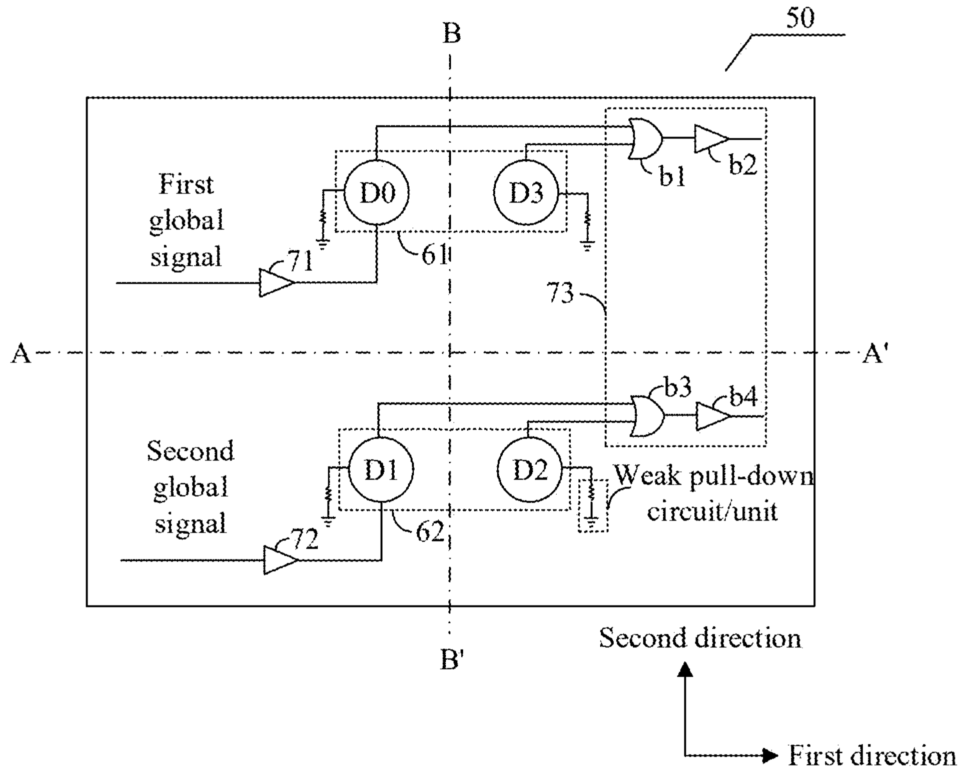
FIG. 13 is a schematic diagram 3 of structural composition of a logic chip according to an embodiment of the present disclosure.

Based on FIG. 12, FIG. 13 is a schematic diagram 3 of structural composition of a logic chip according to an embodiment of the present disclosure. As shown in FIG. 13, in another possible embodiment, the logic chip 50 may further include multiple input drive circuits 73 (in FIG. 13, only one input drive circuit 73 is shown, and the remaining input drive circuits 73 are omitted). Each input drive circuit 73 is coupled to one conductive via group 60.

The logic chip 50 is configured to: send an enable control signal to a target memory chip, and receive, through the input drive circuit 73, the first global signal and the second global signal that are sent by the target memory chip.

Each input drive circuit 73 may include a third OR gate b1, a first input driver b2, a fourth OR gate b3, and a second input driver b4. A first input terminal of the third OR gate b1 is connected to the first conductive via D0, a second input terminal of the third OR gate b1 is connected to the fourth conductive via D3, and an output terminal of the third OR gate b1 is coupled to the first input driver b2. A first input terminal of the fourth OR gate b3 is connected to the second conductive via D1, a second input terminal of the fourth OR gate b3 is connected to the third conductive via D2, and an output terminal of the fourth OR gate b3 is coupled to the second input driver b4.

Specifically, the third OR gate b1 may be coupled to parts, on the active surface, of all conductive vias in the same first dummy conductive via group 61, and the fourth OR gate b3 may be coupled to parts, on the active surface, of all conductive vias in the same second dummy conductive via group 62. In addition, in the global signal region, most signal transmission channels formed by conductive vias are unidirectional transmission channels, that is, transmit global signals to the memory chip 10 through the logic chip 50; and a small quantity of signal transmission channels formed by conductive vias further have a backward transmission function, that is, are bidirectional transmission channels, and may further transmit global signals to the logic chip 50 through the memory chip 10. For the logic chip 50, all conductive vias in some first dummy conductive via groups 61 in the logic chip 50 are coupled to third OR gates b1 corresponding to the some first dummy conductive via groups 61, the third OR gates b1 are coupled to first input drivers b2 corresponding to the third OR gates b1, and global signals transmitted by the first dummy conductive via groups 61 enter the inside of the logic chip 50 through the third OR gates b1 and the first input drivers b2 that are correspondingly coupled to the first dummy conductive via groups 61. Similarly, all conductive vias in some second dummy conductive via groups 62 in the logic chip 50 are coupled to fourth OR gates b3 corresponding to the some second dummy conductive via groups 62, the fourth OR gates b3 are coupled to second input drivers b4 corresponding to the fourth OR gates b3, and global signals transmitted by the second dummy conductive via groups 62 enter the inside of the logic chip 50 through the fourth OR gates b3 and the second input drivers b4 that are correspondingly coupled to the second dummy conductive via groups 62. In addition, a drive circuit may be further included between the third OR gate b1 and all the conductive vias in the first dummy conductive via group 61 to drive the global signal, and a drive circuit may be further included between the fourth OR gate b3 and all the conductive vias in the second dummy conductive via group 62 to drive the global signal. This is not specifically limited.

It should be noted that when multiple memory chips send global signals to the logic chip 50, a memory chip 0 (that is, a first memory chip 11 in a chip-stacked structure 80 in the following description) and a memory chip 3 (that is, a fourth memory chip 14 in the chip-stacked structure 80 in the following description) may utilize the same conductive via. In this case, the logic chip 50 may determine, through the following mechanism, a specific conductive via from which the global signal is sent: If the logic chip 50 needs to receive a global signal from the target memory chip, the logic chip 50 first sends the enable control signal. For example, if the enable control signal is sent to the first memory chip 11, it is subsequently known that a global signal received from the first conductive via D0 or the fourth conductive via D3 is sent by the first memory chip 11; or if the enable control signal is sent to the fourth memory chip 14, it is subsequently known that a global signal received from the first conductive via D0 or the fourth conductive via D3 is sent by the fourth memory chip 14. However, this is not specifically limited. In addition, when multiple memory chips transmit global signals to the logic chip 50, only one memory chip transmits the global signal to the logic chip 50 at the same time.

In some embodiments, as shown in FIG. 13, each conductive via is connected to a weak pull-down circuit. The weak pull-down circuit includes a resistor and a grounding terminal.

The weak pull-down circuit controls a level state of the conductive via to be a low level if the conductive via transmits no signal or is connected abnormally; or a level state of the conductive via depends on a transmitted signal if the conductive via is connected normally and transmits the signal.

It should be noted that in some embodiments, some global signals may be bidirectionally transmitted, that is, may be transmitted from the logic chip 50 to the memory chip 10, and may also be transmitted from the memory chip 10 to the logic chip 50. However, this is not specifically limited. When the global signal is transmitted from the logic chip 50 to the memory chip 10, because each conductive via in the memory chip 10 is connected to the weak pull-down circuit, that is, a default level value of each conductive via is 0, in the first dummy conductive via group 21 or the second dummy conductive via group 22, provided that one of two signal transmission channels formed by conductive vias can transmit signal data normally, even if some conductive vias are open, final signal reception is not affected, that is, a 2-dummy signal transmission architecture is formed.

Similarly, when the global signal is transmitted from the memory chip 10 to the logic chip 50, because each conductive via in the logic chip 50 is connected to the weak pull-down circuit, that is, a default level value of each conductive via is 0, in the first dummy conductive via group 61 or the second dummy conductive via group 62, provided that one of two signal transmission channels formed by conductive vias can transmit signal data normally, even if some conductive vias are open, final signal reception is not affected, that is, a 2-dummy signal transmission architecture is formed.

In some embodiments, each conductive via in the logic chip 50 may be prepared through any one or more of a via-first process, a via-middle process, a via-last process, and a backside via-last process, and different conductive vias in the same logic chip 50 are electrically isolated from each other.

This embodiment of the present disclosure provides a logic chip, and conductive vias in the logic chip are arranged at the same locations as those in the foregoing memory chip. Details not disclosed in this embodiment of the present disclosure may be understood with reference to the descriptions of the foregoing embodiment.

Figure 14:
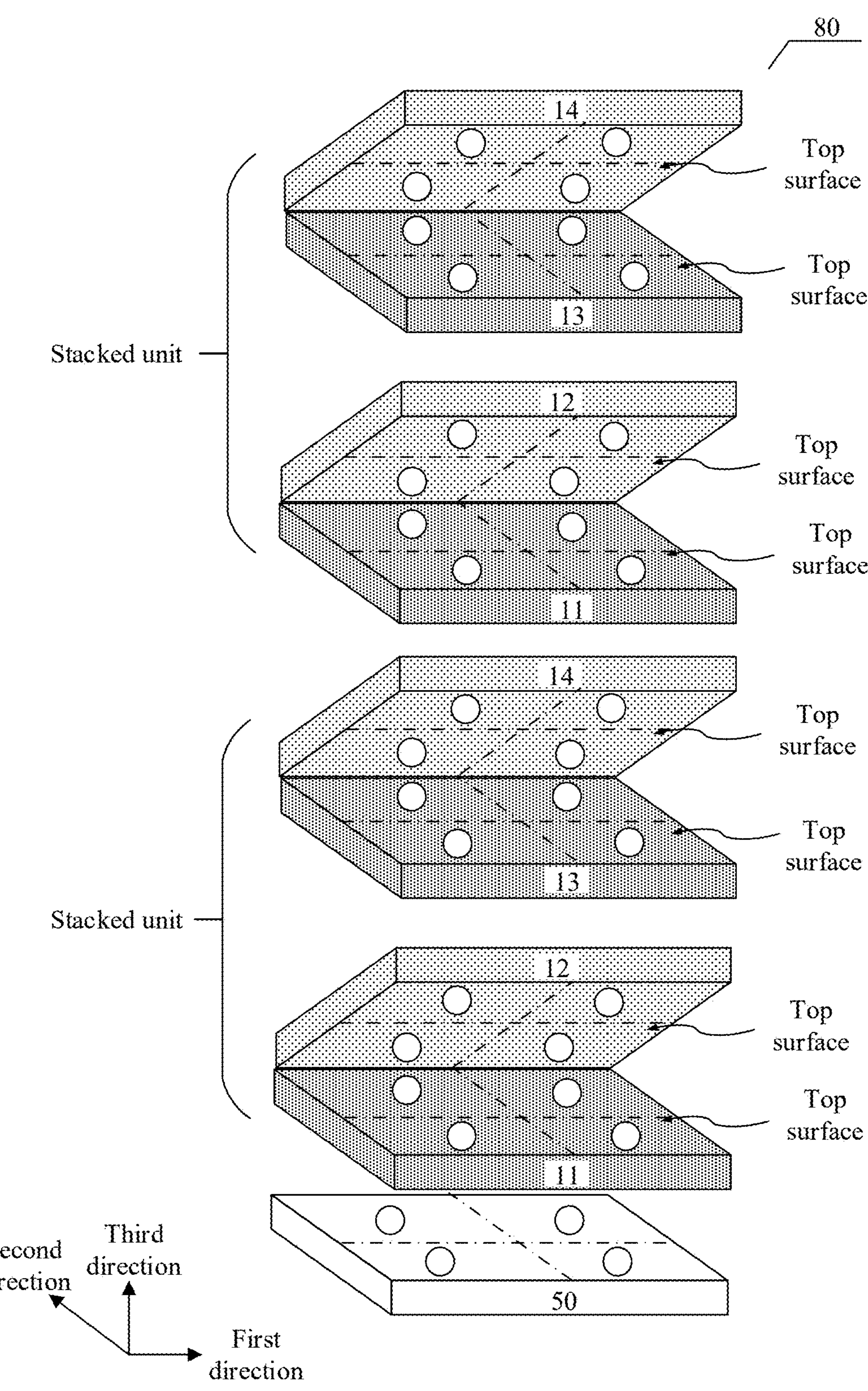
FIG. 14 is a schematic diagram of structural composition of a chip-stacked structure according to an embodiment of the present disclosure.

In still another embodiment of the present disclosure, FIG. 14 is a schematic diagram of structural composition of a chip-stacked structure according to an embodiment of the present disclosure. As shown in FIG. 14, the chip-stacked structure 80 includes a logic chip 50 and at least one stacked unit (in FIG. 14, only two stacked units are shown, and the remaining stacked units are omitted), and the logic chip 50 and the at least one stacked unit are sequentially stacked in a third direction. Each stacked unit includes a first memory chip 11, a second memory chip 12, a third memory chip 13, and a fourth memory chip 14 that are sequentially stacked in the third direction, and the third direction is perpendicular to a top surface of each memory chip. A structure of each of the first memory chip 11, the second memory chip 12, the third memory chip 13, and the fourth memory chip 14 is the foregoing memory chip 10, and a structure of the logic chip 50 is the foregoing logic chip 50. In particular, in FIG. 14, a part shown is merely a global signal region of each chip, not an entire active surface.

For each stacked unit, the first memory chip 11 and the second memory chip 12 are stacked in a face-to-face manner, the second memory chip 12 and the third memory chip 13 are stacked in a back-to-back manner, and the third memory chip 13 and the fourth memory chip 14 are stacked in the face-to-face manner. A first memory chip 11 in the first stacked unit and the logic chip 50 are stacked in a back-to-face manner, or a first memory chip 11 in the first stacked unit and the logic chip 50 are stacked in the back-to-back manner.

In this embodiment of the present disclosure, face-to-face stacking means that top surfaces of two chips are approximately aligned in the third direction, and center points of the two chips, and first axes AA' and second axes BB' of the top surfaces are aligned in the third direction; back-to-back stacking means that bottom surfaces of two chips are approximately aligned in the third direction; and face-to-back stacking means that a top surface of a chip and a bottom surface of another chip are approximately aligned in the third direction. When no logic chip or memory chip is specified, the "chip" may be either a logic chip or a memory chip.

In addition, n conductive via groups (in FIG. 14, only one conductive via group is shown, and the remaining conductive via groups are omitted) in the logic chip 50 are in a one-to-one correspondence with and aligned in the third direction with n conductive via groups in each first memory chip 11, n conductive via groups in each second memory chip 12, n conductive via groups in each third memory chip 13, and n conductive via groups in each fourth memory chip 14, where n is a positive integer.

It should be further noted that due to a process error, "alignment" in this specification is not absolute alignment, and it may be considered that there is alignment provided that a deviation falls within a proper range.

In this embodiment of the present disclosure, the chip-stacked structure 80 may be specifically a high bandwidth memory (HBM) stacked product, particularly relates to a repair pattern design of multiple (Multidrop) conductive vias in a global signal region in each chip in the case of 4-quadrant symmetry (that is, the conductive via group is symmetric about the first axis and also symmetric about the second axis) in each chip, utilizes face-to-face and back-to-back symmetry between the multiple conductive vias and chips, and is applied to transmitting a signal, e.g., a reset signal, a power-on signal, a stacking identification signal SID/CID, a power supply-related signal Voltage Monitor, or a timing-related signal Timing Aligner, through the multiple conductive vias. This is not specifically limited. Herein, the memory chip may be represented by a core die, and the logic chip may be represented by a base die.

It should be noted that in a possible embodiment, for two chips stacked face-to-face, (locations, at which conductive vias are aligned in the third direction, on) bonding surfaces of the two chips are electrically connected through a hybrid bonding (Hyperbonding, which is also referred to as a bonding pillar) process; and for two chips stacked back-to-back or for two chips stacked back-to-face, (locations, at which conductive vias are aligned in the third direction, on) bonding surfaces of the two chips are electrically connected through a conductive bump (UBump, which is also referred to as a micro-bump) bonding process.

In another possible embodiment, for two chips stacked face-to-face, for two chips stacked back-to-back, or for two chips stacked back-to-face, (locations, at which conductive vias are aligned in the third direction, on) bonding surfaces of the two chips are electrically connected through a hybrid bonding process.

In still another possible embodiment, for two chips stacked face-to-face, for two chips stacked back-to-back, or for two chips stacked back-to-face, (locations, at which conductive vias are aligned in the third direction, on) bonding surfaces of the two chips are electrically connected through a conductive bump bonding process.

Herein, the foregoing chip may be the logic chip 50, or may be the memory chip 10.

It should be noted that compared with the conductive bump bonding process, a face-to-face stacking utilizing the hybrid bonding process can make adjacent memory chips adhere more closely, with basically no gaps, to significantly reduce the height of the chip-stacked structure. This is also one of the advantages of face-to-face stacking. Certainly, two memory chips stacked back-to-back may alternatively be electrically connected through the hybrid bonding process. However, connection performance in the hybrid bonding process is poorer than that achieved when an electrical connection is implemented through the conductive bump process. In this way, in this embodiment of the present disclosure, the chip-stacked structure supports face-to-face stacking, and has better performance.

It should be understood that the logic chip 50 or each memory chip may be divided into a high-order transmission region and a low-order transmission region, and arrows in FIG. 15A to FIG. 18B in the following description are all located in the high-order transmission region of the chip. In particular, in this embodiment of the present disclosure, the high-order transmission region and the low-order transmission region are merely two regions that distinguish the logic chip 50 or each memory chip, do not constitute additional limitations, and may not be directly related to high-order data and low-order data that are commonly known in data transmission. In addition, only one conductive via group in the global signal region is shown in FIG. 14 to FIG. 19 as an example. However, actually, there are multiple conductive via groups in the global signal region, and different conductive via groups have similar alignment characteristics. Alignment of the remaining conductive vias is not shown. For adaptive understanding, reference is made to the following text descriptions and FIG. 14 to FIG. 19.

It should be noted that a top surface of the logic chip 50 or each memory chip is divided into 2×2 signal regions: a first signal region, a second signal region, a third signal region, and a fourth signal region, which are represented by C, D, E, and F. The first signal region (C) and the second signal region (D) are symmetric along a first axis AA' of the first signal region (C) and the second signal region (D), the first signal region (C) and the fourth signal region (F) are symmetric along a second axis BB' of the first signal region (C) and the fourth signal region (F), and the third signal region (E) and the fourth signal region (F) are symmetric along a first axis AA' of the third signal region (E) and the fourth signal region (F). Respective first axes AA' of the logic chip 50 and each memory chip are aligned in the third direction, and respective second axes BB' of the logic chip 50 and each memory chip are aligned in the third direction.

It should be noted that a first conductive via D0 in each conductive via group is located in the first signal region (C), a second conductive via D1 in each conductive via group is located in the second signal region (D), a third conductive via D2 in each conductive via group is located in the third signal region (E), and a fourth conductive via D3 in each conductive via group is located in the fourth signal region (F).

When the logic chip 50 and the first memory chip 11 are stacked in the back-to-back manner and the logic chip 50 and the fourth memory chip 14 are placed in the same manner, a first specific implementation and a second specific embodiment manner are provided. When the logic chip 50 and the first memory chip 11 are stacked in the back-to-back manner and the logic chip 50 and the second memory chip 12 are placed in the same manner, a third specific implementation and a fourth specific embodiment manner are provided. Specific descriptions are as follows.

Figure 15A:
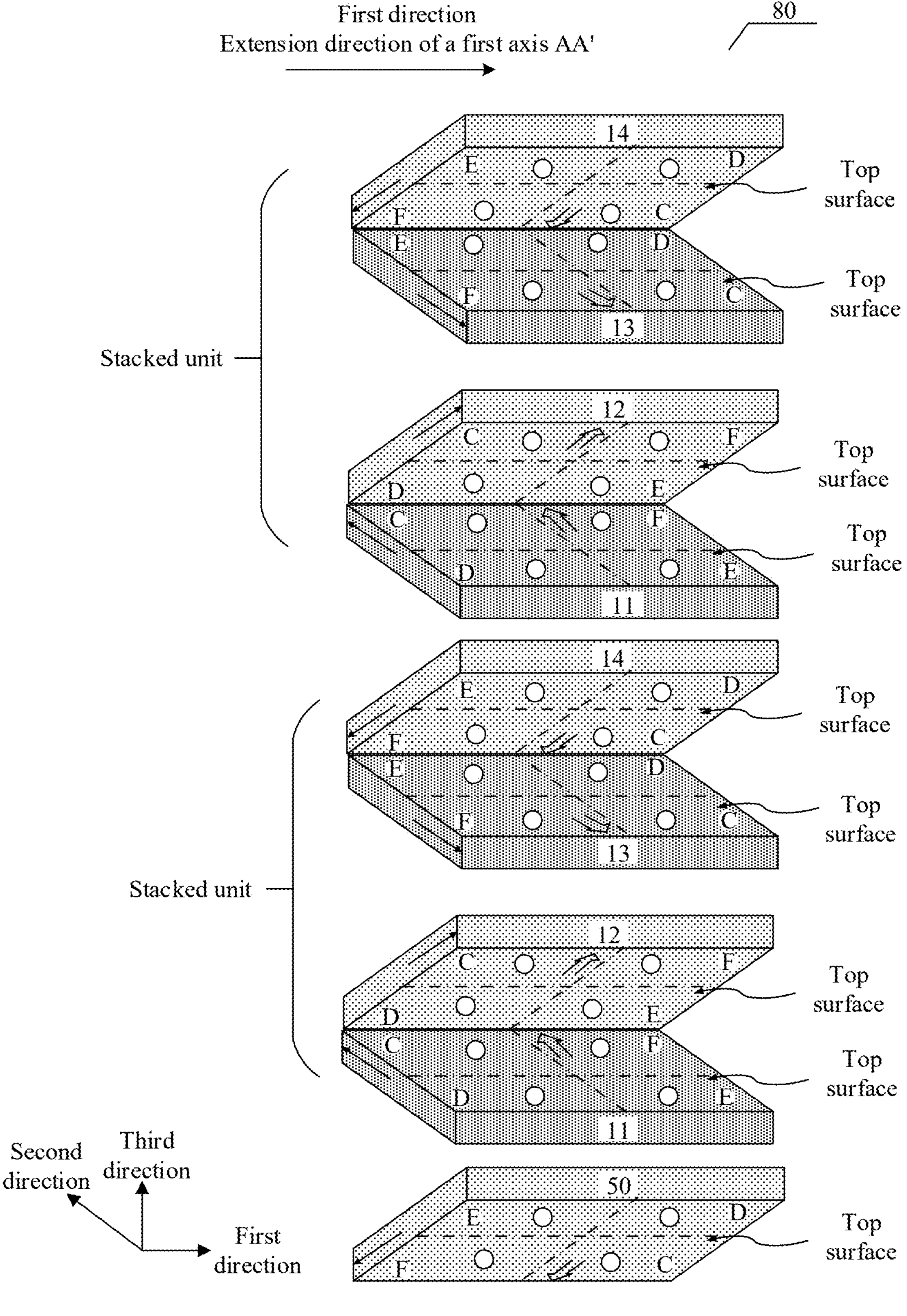
FIG. 15A/

In a first specific embodiment, as shown in FIG. 15A, if the respective first axes AA' of the logic chip 50 and each memory chip divide the chips to which the first axes AA' belong into high-order transmission regions and low-order transmission regions (that is, the first axis AA' extends in a first direction, the first signal region (C) and the fourth signal region (F) are located in the high-order transmission region, and the second signal region (D) and the third signal region (E) are located in the low-order transmission region), the high-order transmission region of the logic chip 50, a high-order transmission region of the first memory chip 11, a low-order transmission region of the second memory chip 12, a low-order transmission region of the third memory chip 13, and a high-order transmission region of the fourth memory chip 14 are aligned in the third direction; and the low-order transmission region of the logic chip 50, a low-order transmission region of the first memory chip 11, a high-order transmission region of the second memory chip 12, a high-order transmission region of the third memory chip 13, and a low-order transmission region of the fourth memory chip 14 are aligned in the third direction.

Figure 16A:
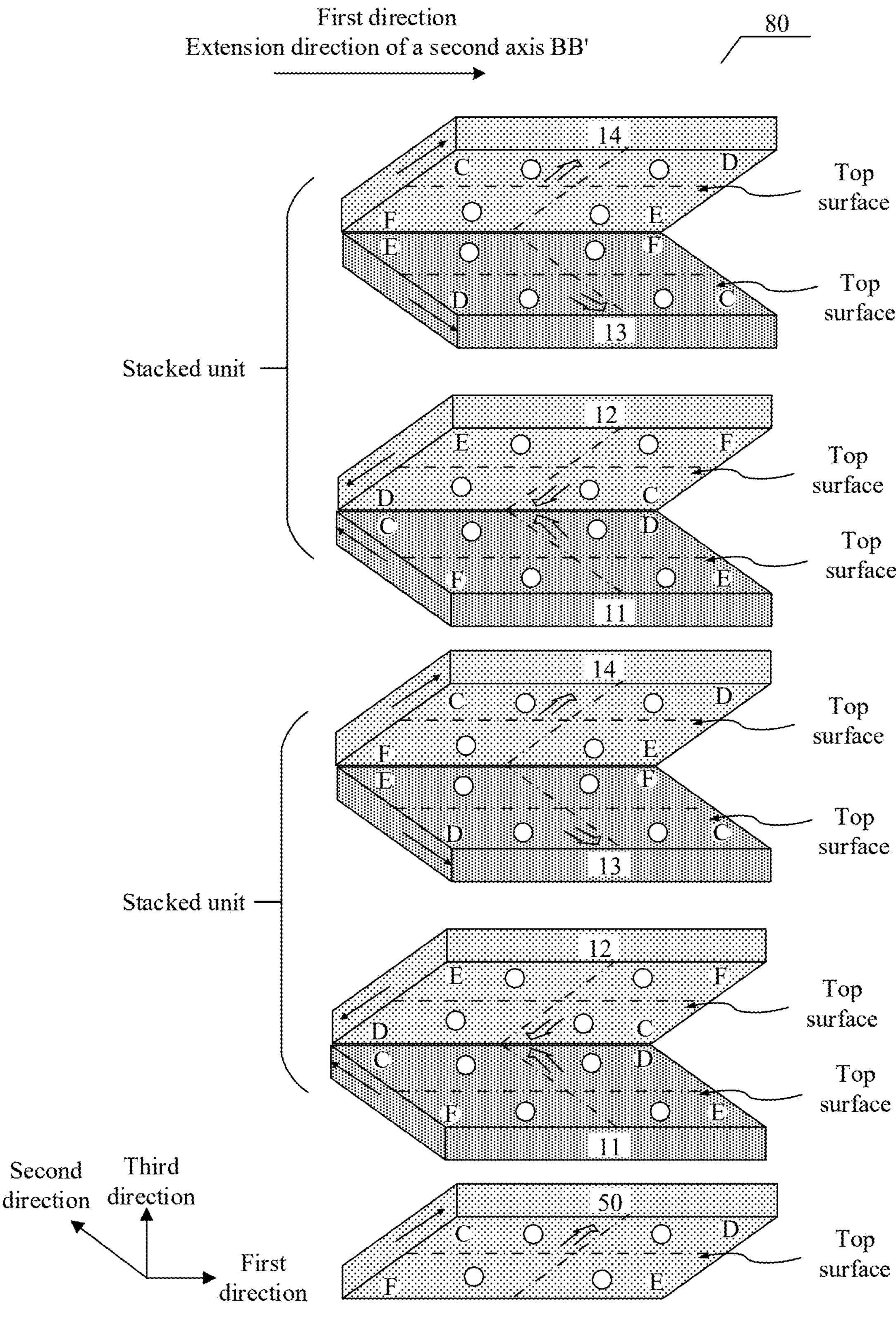
FIG. 16A/

In a second specific embodiment, as shown in FIG. 16A, if the respective second axes BB' of the logic chip 50 and each memory chip divide the chips to which the second axes BB' belong into high-order transmission regions and low-order transmission regions (that is, the second axis BB' extends in a first direction, the first signal region (C) and the second signal region (D) are located in the high-order transmission region, and the third signal region (E) and the fourth signal region (F) are located in the low-order transmission region), the high-order transmission region of the logic chip 50, a low-order transmission region of the first memory chip 11, a low-order transmission region of the second memory chip 12, a high-order transmission region of the third memory chip 13, and a high-order transmission region of the fourth memory chip 14 are aligned in the third direction; and the low-order transmission region of the logic chip 50, a high-order transmission region of the first memory chip 11, a high-order transmission region of the second memory chip 12, a low-order transmission region of the third memory chip 13, and a low-order transmission region of the fourth memory chip 14 are aligned in the third direction.

Referring to FIG. 15A or FIG. 16A, for the first specific embodiment and the second specific embodiment, there is the following alignment relationship between signal regions:

(1) The fourth signal region (F) of the logic chip 50, a first signal region (C) of the first memory chip 11, a second signal region (D) of the second memory chip 12, a third signal region (E) of the third memory chip 13, and a fourth signal region (F) of the fourth memory chip 14 are aligned in the third direction.

(2) The third signal region (E) of the logic chip 50, a second signal region (D) of the first memory chip 11, a first signal region (C) of the second memory chip 12, a fourth signal region (F) of the third memory chip 13, and a third signal region (E) of the fourth memory chip 14 are aligned in the third direction.

(3) The second signal region (D) of the logic chip 50, a third signal region (E) of the first memory chip 11, a fourth signal region (F) of the second memory chip 12, a first signal region (C) of the third memory chip 13, and a second signal region (D) of the fourth memory chip 14 are aligned in the third direction.

(4) The first signal region (C) of the logic chip 50, a fourth signal region (F) of the first memory chip 11, a third signal region (E) of the second memory chip 12, a second signal region (D) of the third memory chip 13, and a first signal region (C) of the fourth memory chip 14 are aligned in the third direction.

It should be further noted that each conductive via group in the logic chip 50 and each memory chip includes a first conductive via D0, a second conductive via D1, a third conductive via D2, and a fourth conductive via D3 that are distributed in a 2×2 array.

Figure 15B:
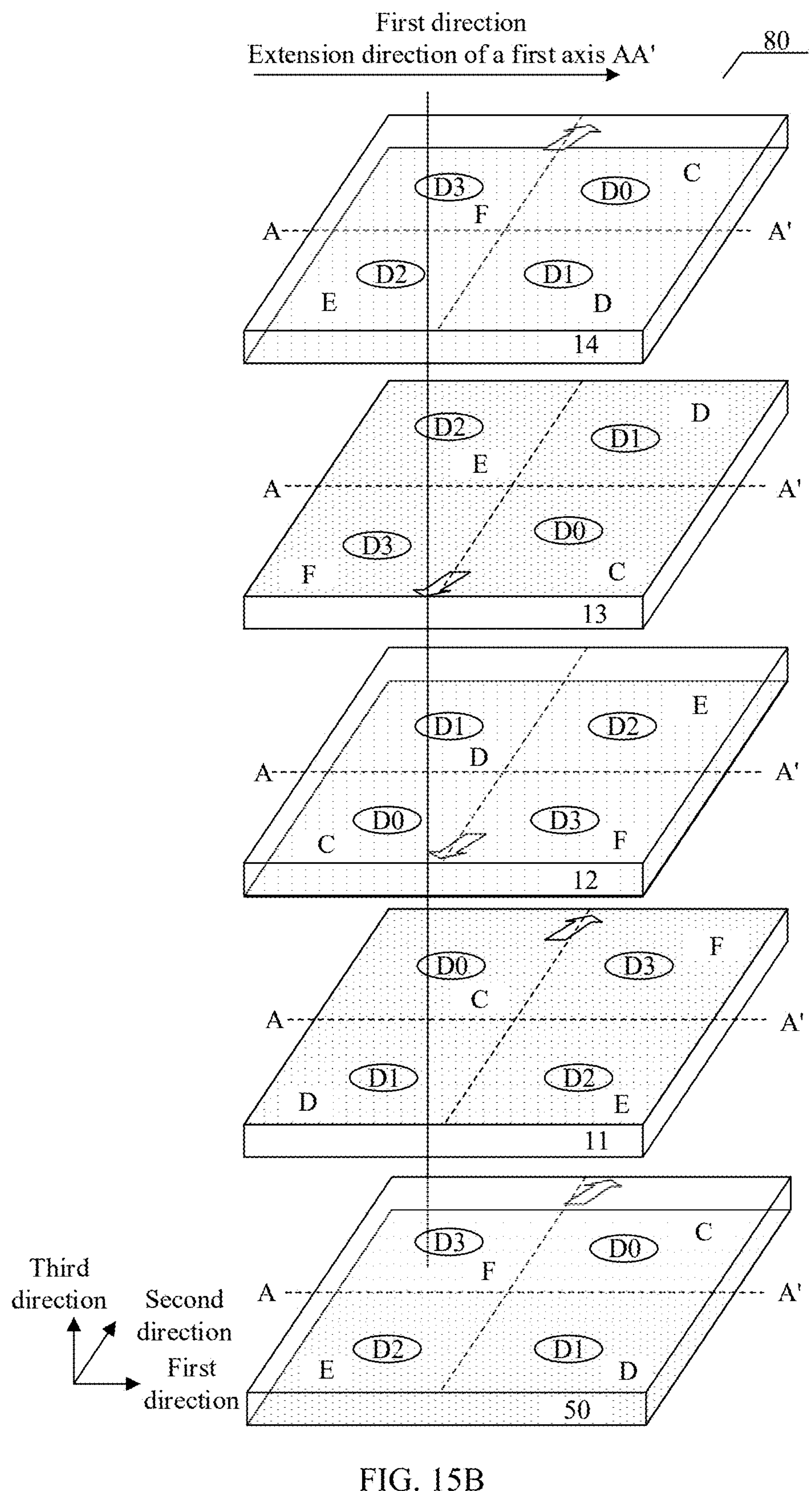
FIG. 15B is a specific schematic diagram 1 of a chip-stacked structure according to an embodiment of the present disclosure.
Figure 16B:
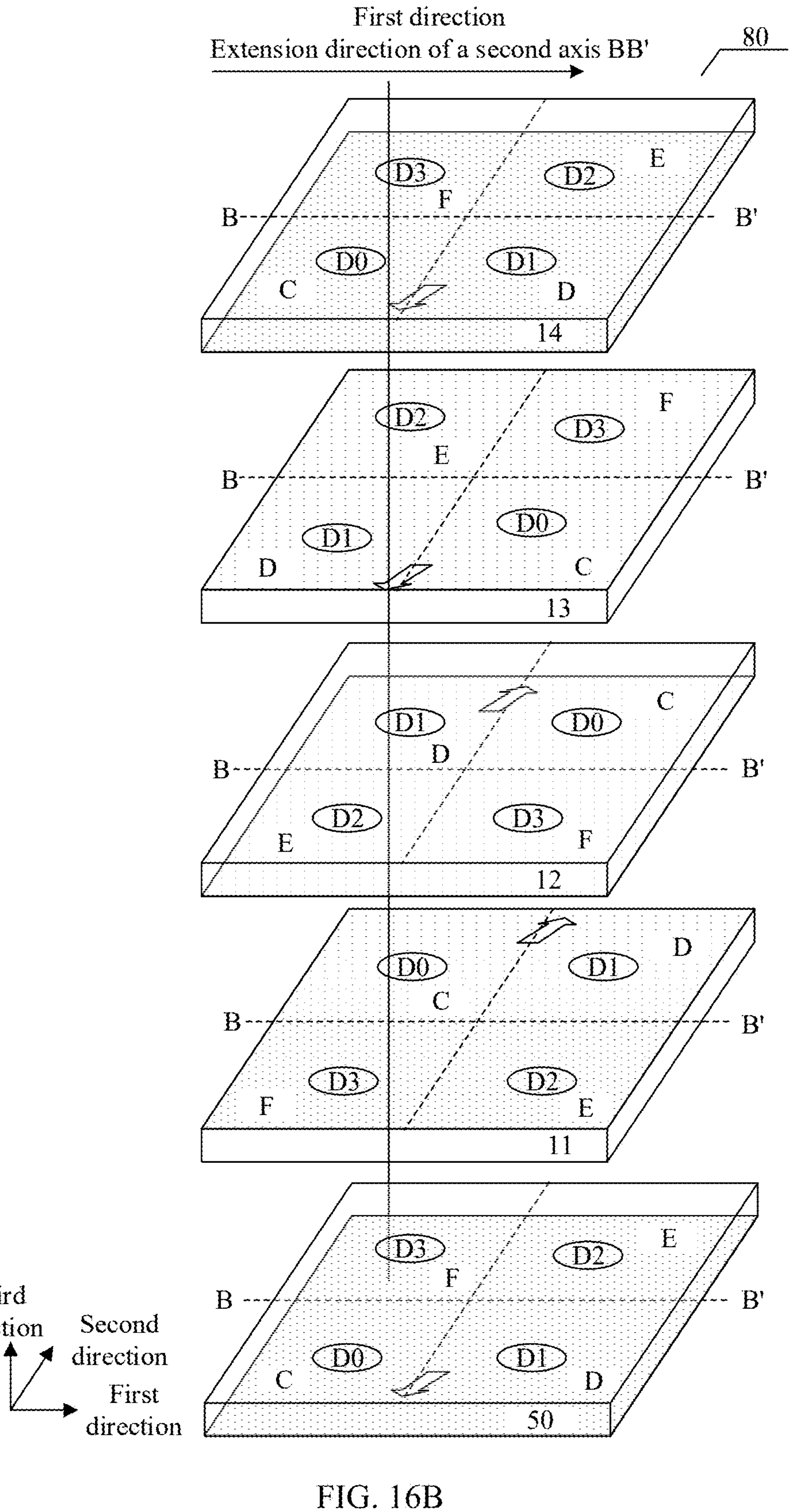
FIG. 16B is a specific schematic diagram 2 of a chip-stacked structure according to an embodiment of the present disclosure.

Referring to FIG. 15B or FIG. 16B, for the first specific embodiment and the second specific embodiment, there is the following alignment relationship between conductive vias only for multiple signal regions aligned in the third direction:

(1) A fourth conductive via D3 in the ith first dummy conductive via group in the logic chip 50, a first conductive via D0 in the ith first dummy conductive via group in each first memory chip 11, a second conductive via D1 in the ith second dummy conductive via group in each second memory chip 12, a third conductive via D2 in the ith second dummy conductive via group in each third memory chip 13, and a fourth conductive via D3 in the ith first dummy conductive via group in each fourth memory chip 14 are aligned in the third direction, and constitute one signal transmission channel.

(2) A third conductive via D2 in the ith second dummy conductive via group in the logic chip 50, a second conductive via D1 in the ith second dummy conductive via group in each first memory chip 11, a first conductive via D0 in the ith first dummy conductive via group in each second memory chip 12, a fourth conductive via D3 in the ith first dummy conductive via group in each third memory chip 13, and a third conductive via D2 in the ith second dummy conductive via group in each fourth memory chip 14 are aligned in the third direction, and constitute one signal transmission channel.

(3) A second conductive via D1 in the ith second dummy conductive via group in the logic chip 50, a third conductive via D2 in the ith second dummy conductive via group in each first memory chip 11, a fourth conductive via D3 in the ith first dummy conductive via group in each second memory chip 12, a first conductive via D0 in the ith first dummy conductive via group in each third memory chip 13, and a second conductive via D1 in the ith second dummy conductive via group in each fourth memory chip 14 are aligned in the third direction, and constitute one signal transmission channel.

(4) A first conductive via D0 in the ith first dummy conductive via group in the logic chip 50, a fourth conductive via D3 in the ith first dummy conductive via group in each first memory chip 11, a third conductive via D2 in the ith second dummy conductive via group in each second memory chip 12, a second conductive via D1 in the ith second dummy conductive via group in each third memory chip 13, and a first conductive via D0 in the ith first dummy conductive via group in each fourth memory chip 14 are aligned in the third direction, and constitute one signal transmission channel.

It should be noted that i is a positive integer less than or equal to n.

Referring to FIG. 15A and FIG. 15B, an arrow direction of each chip is a high-order transmission region; a memory chip at a first-type location is a memory chip in which a high-order transmission region (that is, a region in which a first signal region (C) and a fourth signal region (F) are located) is located on a side to which an arrow of a second direction points, that is, the memory chip 11 and the memory chip 14; and a memory chip at a second-type location is a memory chip in which a low-order transmission region (that is, a region in which a second signal region (D) and a third signal region (E) are located) is located on the side to which the arrow of the second direction points, that is, the memory chip 12 and the memory chip 13. Referring to FIG. 16A and FIG. 16B, a memory chip at a first-type location is a memory chip in which a high-order transmission region (that is, a region in which a first signal region (C) and a second signal region (D) are located) is located on a side to which an arrow of a second direction points, that is, the memory chip 11 and the memory chip 12; and a memory chip at a second-type location is a memory chip in which a low-order transmission region (that is, a region in which a third signal region (E) and a fourth signal region (F) are located) is located on the side to which the arrow of the second direction points, that is, the memory chip 13 and the memory chip 14.

For the first specific embodiment and the second specific embodiment, in some embodiments, the high-order transmission region of the first memory chip 11, the low-order transmission region of the second memory chip 12, the low-order transmission region of the third memory chip 13, and the high-order transmission region of the fourth memory chip 14 are aligned.

Alternatively, the high-order transmission region of the first memory chip 11, the high-order transmission region of the second memory chip 12, the low-order transmission region of the third memory chip 13, and the low-order transmission region of the fourth memory chip 14 are aligned.

Specifically, referring to FIG. 15A and FIG. 15B, in the first specific embodiment, the high-order transmission region of the first memory chip 11, the low-order transmission region of the second memory chip 12, the low-order transmission region of the third memory chip 13, and the high-order transmission region of the fourth memory chip 14 are aligned. Referring to FIG. 16A and FIG. 16B, in the second specific embodiment, the high-order transmission region of the first memory chip 11, the high-order transmission region of the second memory chip 12, the low-order transmission region of the third memory chip 13, and the low-order transmission region of the fourth memory chip 14 are aligned.

Figure 17A:
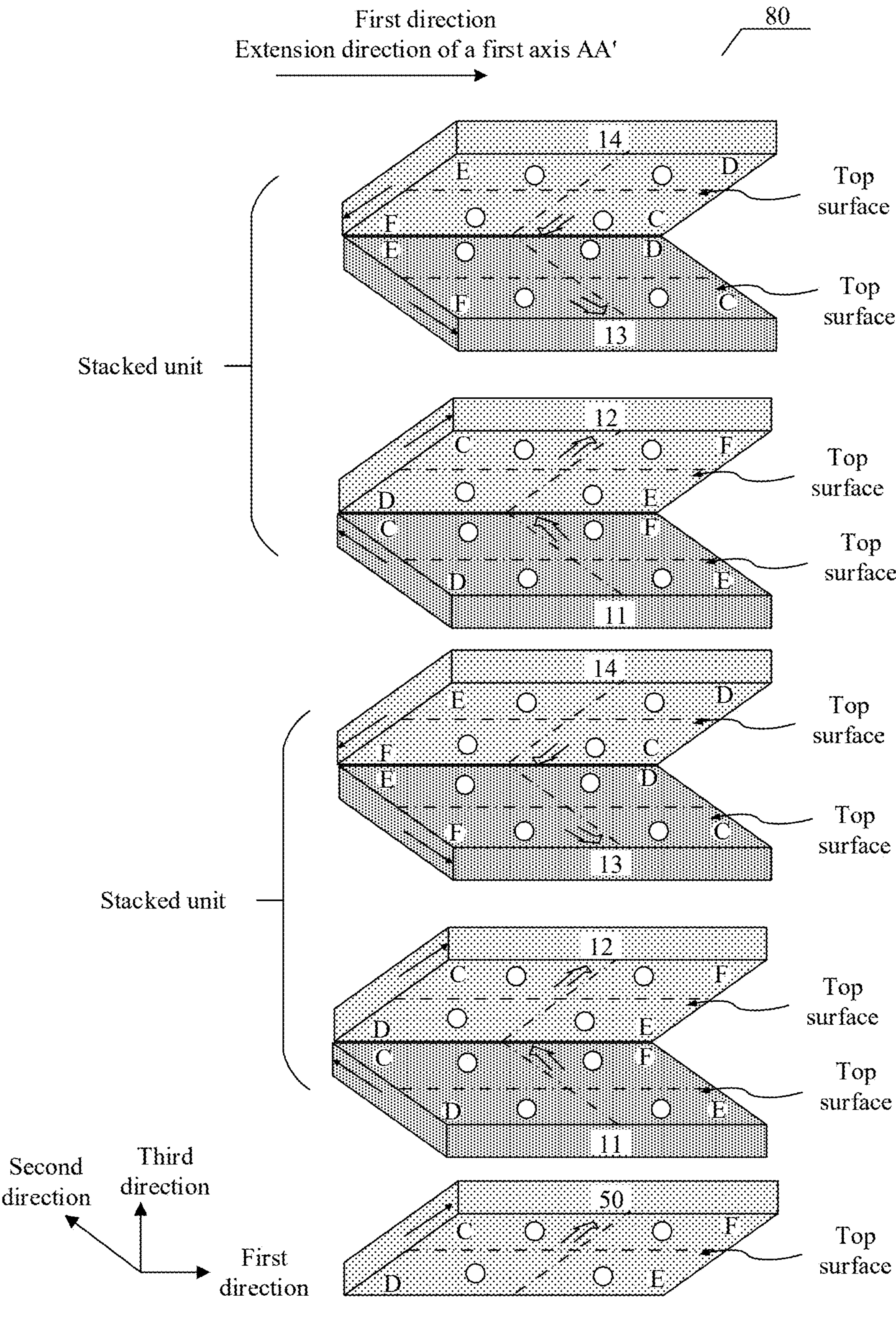
FIG. 17A/

In a third specific embodiment, as shown in FIG. 17A, if the respective first axes AA' of the logic chip 50 and each memory chip divide the chips to which the first axes AA' belong into high-order transmission regions and low-order transmission regions (that is, the first axis AA' extends in a first direction, the first signal region (C) and the fourth signal region (F) are located in the high-order transmission region, and the second signal region (D) and the third signal region (E) are located in the low-order transmission region), the low-order transmission region of the logic chip 50, a high-order transmission region of the first memory chip 11, a low-order transmission region of the second memory chip 12, a low-order transmission region of the third memory chip 13, and a high-order transmission region of the fourth memory chip 14 are aligned in the third direction; and the high-order transmission region of the logic chip 50, a low-order transmission region of the first memory chip 11, a high-order transmission region of the second memory chip 12, a high-order transmission region of the third memory chip 13, and a low-order transmission region of the fourth memory chip 14 are aligned in the third direction.

Figure 18A:
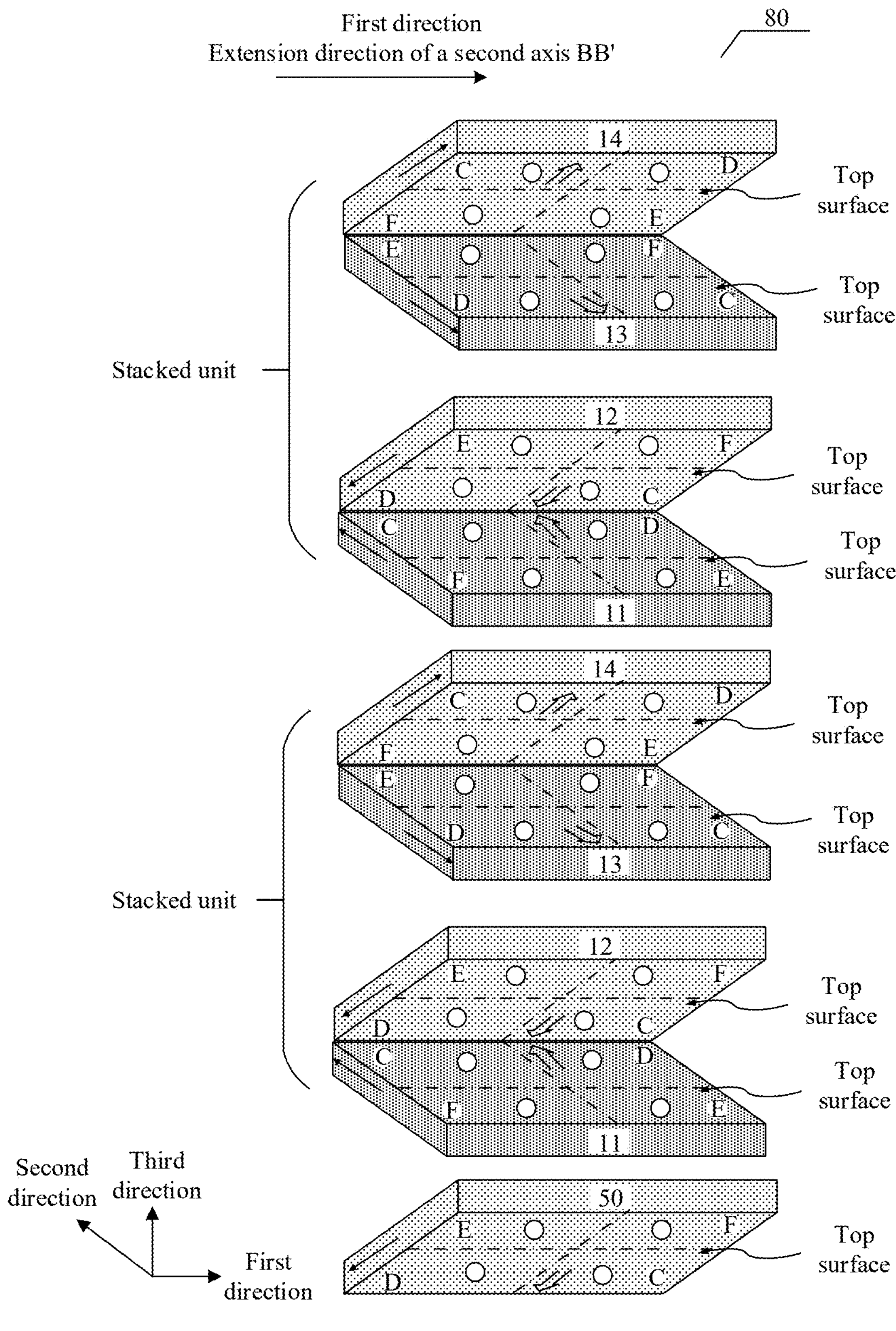
FIG. 18A/

In a fourth specific embodiment, as shown in FIG. 18A, if the respective second axes BB' of the logic chip 50 and each memory chip divide the chips to which the second axes BB' belong into high-order transmission regions and low-order transmission regions (that is, the second axis BB' extends in a first direction, the first signal region (C) and the second signal region (D) are located in the high-order transmission region, and the third signal region (E) and the fourth signal region (F) are located in the low-order transmission region), the low-order transmission region of the logic chip 50, a low-order transmission region of the first memory chip 11, a low-order transmission region of the second memory chip 12, a high-order transmission region of the third memory chip 13, and a high-order transmission region of the fourth memory chip 14 are aligned in the third direction; and the high-order transmission region of the logic chip 50, a high-order transmission region of the first memory chip 11, a high-order transmission region of the second memory chip 12, a low-order transmission region of the third memory chip 13, and a low-order transmission region of the fourth memory chip 14 are aligned in the third direction.

Referring to FIG. 17A or FIG. 18A, for the third specific embodiment and the fourth specific embodiment, there is the following alignment relationship between signal regions:

(1) The second signal region (D) of the logic chip 50, a first signal region (C) of the first memory chip 11, a second signal region (D) of the second memory chip 12, a third signal region (E) of the third memory chip 13, and a fourth signal region (F) of the fourth memory chip 14 are aligned in the third direction.

(2) The first signal region (C) of the logic chip 50, a second signal region (D) of the first memory chip 11, a first signal region (C) of the second memory chip 12, a fourth signal region (F) of the third memory chip 13, and a third signal region (E) of the fourth memory chip 14 are aligned in the third direction.

(3) The fourth signal region (F) of the logic chip 50, a third signal region (E) of the first memory chip 11, a fourth signal region (F) of the second memory chip 12, a first signal region (C) of the third memory chip 13, and a second signal region (D) of the fourth memory chip 14 are aligned in the third direction.

(4) The third signal region (E) of the logic chip 50, a fourth signal region (F) of the first memory chip 11, a third signal region (E) of the second memory chip 12, a second signal region (D) of the third memory chip 13, and a first signal region (C) of the fourth memory chip 14 are aligned in the third direction.

Figure 17B:
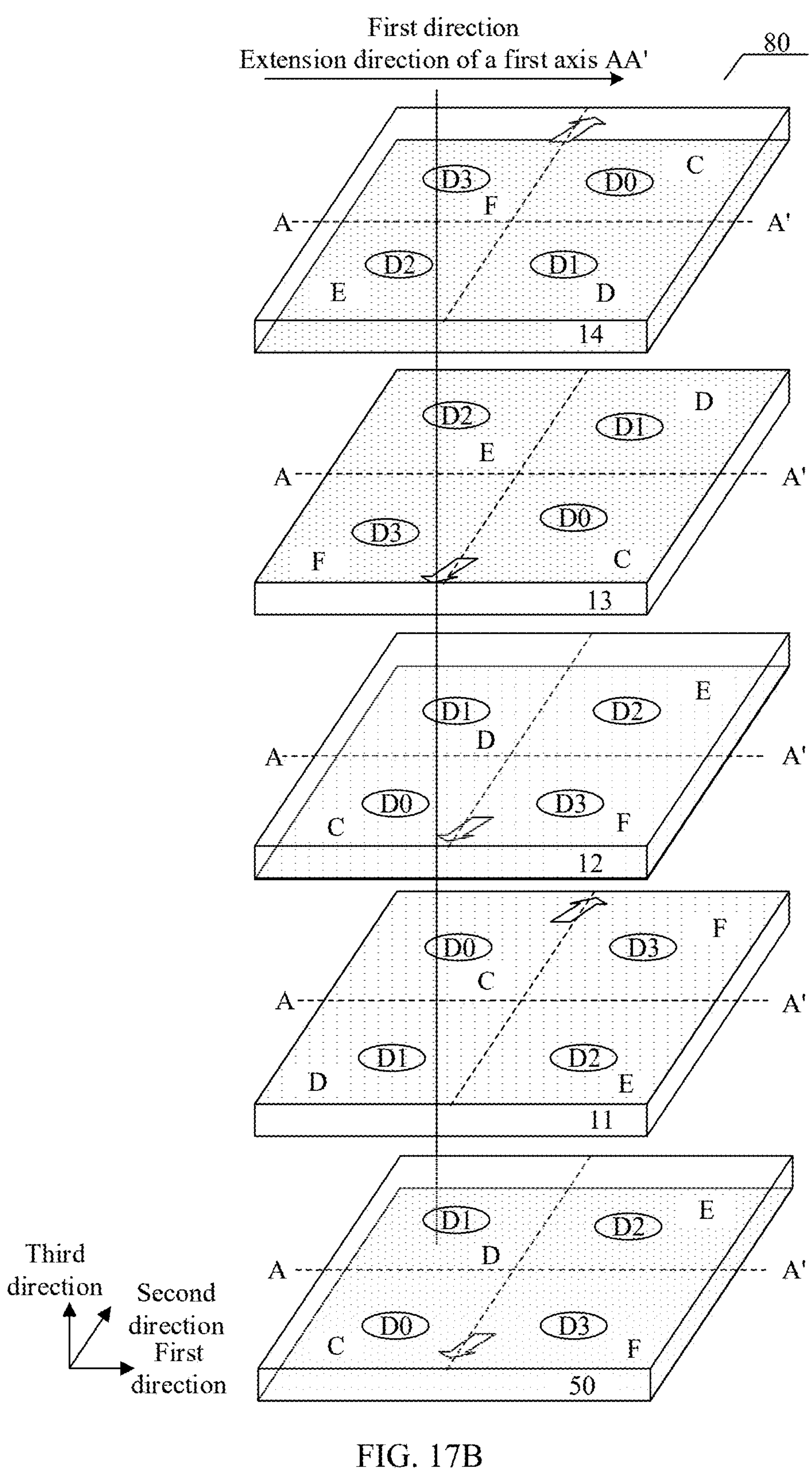
FIG. 17B is a specific schematic diagram 3 of a chip-stacked structure according to an embodiment of the present disclosure.
Figure 18B:
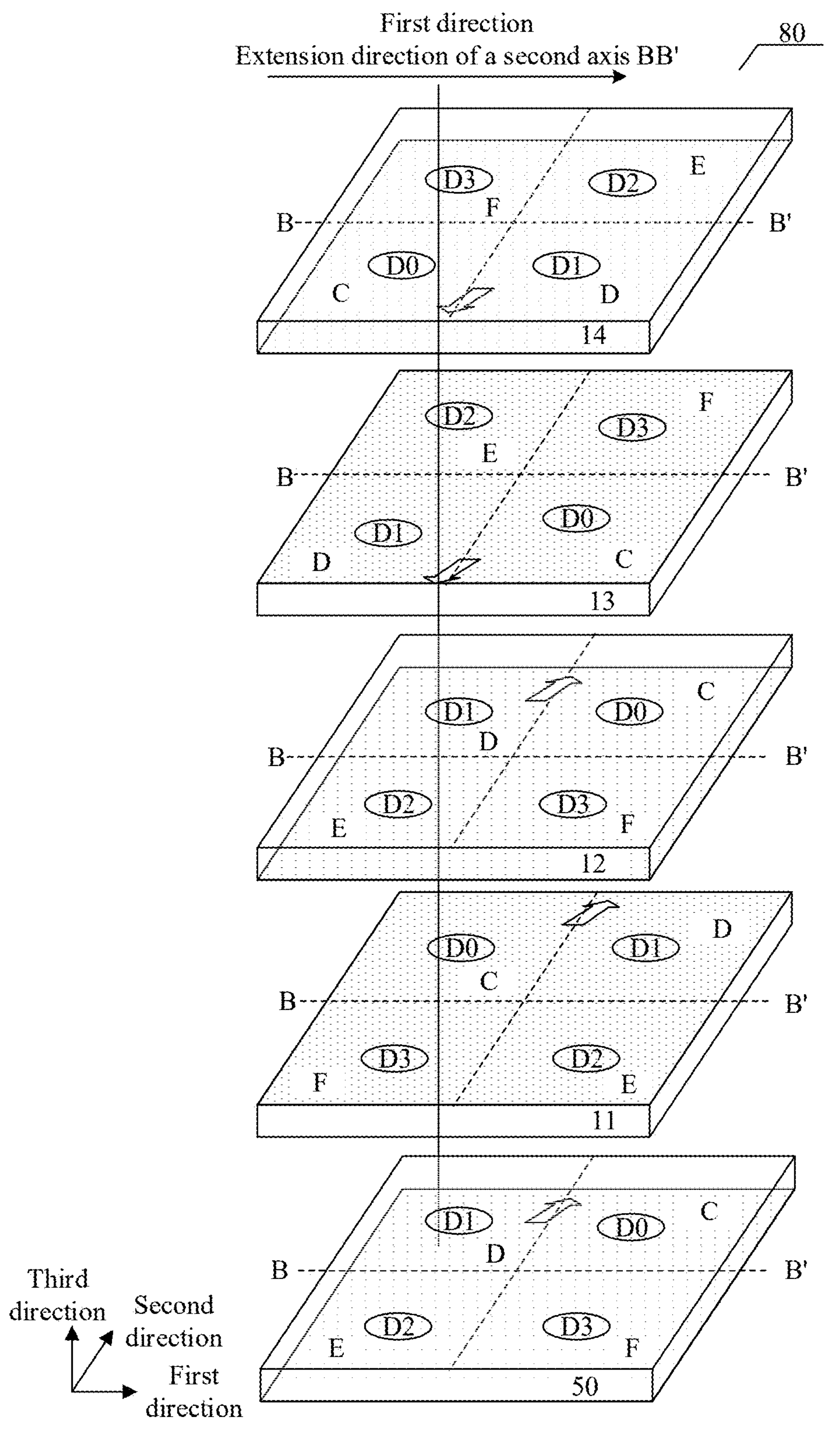
FIG. 18B is a specific schematic diagram 4 of a chip-stacked structure according to an embodiment of the present disclosure.

Referring to FIG. 17B or FIG. 18B, for the third specific embodiment and the fourth specific embodiment, there is the following alignment relationship between conductive vias only for multiple signal regions aligned in the third direction:

(1) A second conductive via D1 in the ith second dummy conductive via group in the logic chip 50, a first conductive via D0 in the ith first dummy conductive via group in each first memory chip 11, a second conductive via D1 in the ith second dummy conductive via group in each second memory chip 12, a third conductive via D2 in the ith second dummy conductive via group in each third memory chip 13, and a fourth conductive via D3 in the ith first dummy conductive via group in each fourth memory chip 14 are aligned in the third direction, and constitute one signal transmission channel.

(2) A first conductive via D0 in the ith first dummy conductive via group in the logic chip 50, a second conductive via D1 in the ith second dummy conductive via group in each first memory chip 11, a first conductive via D0 in the ith first dummy conductive via group in each second memory chip 12, a fourth conductive via D3 in the ith first dummy conductive via group in each third memory chip 13, and a third conductive via D2 in the ith second dummy conductive via group in each fourth memory chip 14 are aligned in the third direction, and constitute one signal transmission channel.

(3) A fourth conductive via D3 in the ith first dummy conductive via group in the logic chip 50, a third conductive via D2 in the ith second dummy conductive via group in each first memory chip 11, a fourth conductive via D3 in the ith first dummy conductive via group in each second memory chip 12, a first conductive via D0 in the ith first dummy conductive via group in each third memory chip 13, and a second conductive via D1 in the ith second dummy conductive via group in each fourth memory chip 14 are aligned in the third direction, and constitute one signal transmission channel.

(4) A third conductive via D2 in the ith second dummy conductive via group in the logic chip 50, a fourth conductive via D3 in the ith first dummy conductive via group in each first memory chip 11, a third conductive via D2 in the ith second dummy conductive via group in each second memory chip 12, a second conductive via D1 in the ith second dummy conductive via group in each third memory chip 13, and a first conductive via D0 in the ith first dummy conductive via group in each fourth memory chip 14 are aligned in the third direction, and constitute one signal transmission channel.

Referring to FIG. 17A and FIG. 17B, a memory chip at a first-type location is a memory chip in which a high-order transmission region (that is, a region in which a first signal region (C) and a fourth signal region (F) are located) is located on a side to which an arrow of a second direction points, that is, the memory chip 11 and the memory chip 14; and a memory chip at a second-type location is a memory chip in which a low-order transmission region (that is, a region in which a second signal region (D) and a third signal region (E) are located) is located on the side to which the arrow of the second direction points, that is, the memory chip 12 and the memory chip 13. Referring to FIG. 18A and FIG. 18B, a memory chip at a first-type location is a memory chip in which a high-order transmission region (that is, a region in which a first signal region (C) and a second signal region (D) are located) is located on a side to which an arrow of a second direction points, that is, the memory chip 11 and the memory chip 12; and a memory chip at a second-type location is a memory chip in which a low-order transmission region (that is, a region in which a third signal region (E) and a fourth signal region (F) are located) is located on the side to which the arrow of the second direction points, that is, the memory chip 13 and the memory chip 14.

For the third specific embodiment and the fourth specific embodiment, in some embodiments, the high-order transmission region of the first memory chip 11, the low-order transmission region of the second memory chip 12, the low-order transmission region of the third memory chip 13, and the high-order transmission region of the fourth memory chip 14 are aligned.

Alternatively, the high-order transmission region of the first memory chip 11, the high-order transmission region of the second memory chip 12, the low-order transmission region of the third memory chip 13, and the low-order transmission region of the fourth memory chip 14 are aligned.

Specifically, referring to FIG. 17A and FIG. 17B, in the third specific embodiment, the high-order transmission region of the first memory chip 11, the low-order transmission region of the second memory chip 12, the low-order transmission region of the third memory chip 13, and the high-order transmission region of the fourth memory chip 14 are aligned. Referring to FIG. 18A and FIG. 18B, in the fourth specific embodiment, the high-order transmission region of the first memory chip 11, the high-order transmission region of the second memory chip 12, the low-order transmission region of the third memory chip 13, and the low-order transmission region of the fourth memory chip 14 are aligned.

Figure 19:
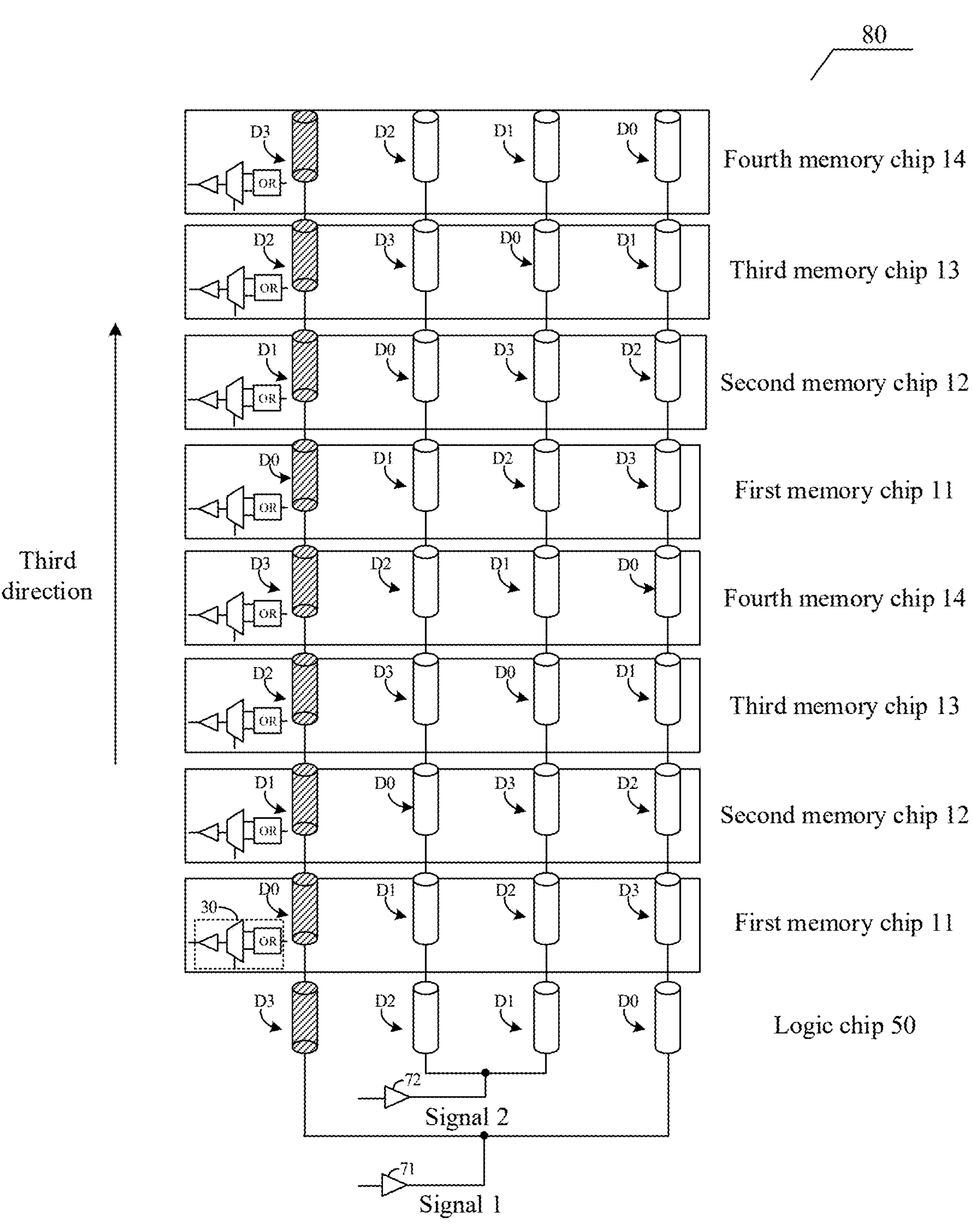
FIG. 19 is a schematic diagram of signal transmission in a chip-stacked structure according to an embodiment of the present disclosure.

In some embodiments, FIG. 19 is a schematic diagram of signal transmission in a chip-stacked structure according to an embodiment of the present disclosure. In particular, FIG. 19 is shown for the chip-stacked structures shown in FIG. 15A to FIG. 16B. In addition, FIG. 19 is merely an abstracted circuit schematic diagram in which "OR" represents a first OR gate and a second OR gate, and a first signal selection circuit and a second signal selection circuit are shown together. An input selection circuit 30 in FIG. 19 is merely simply placed next to the conductive via, and no specific connection relationship is drawn. For adaptive understanding, reference is made to the text descriptions. In FIG. 19, Signal 1 represents a first global signal, and Signal 2 represents a second global signal.

In this way, referring to FIG. 19, for the chip-stacked structure 80, a signal transmission path from bottom to top is similar to the following form for transmission: a fourth conductive via D3 in the logic chip 50—a first conductive via D0 in the first memory chip 11—a second conductive via D1 in the second memory chip 12—a third conductive via D2 in the third memory chip 13—a fourth conductive via D3 in the fourth memory chip 14 . . . , and there is a similar case for the remaining signals. That is, for the chip-stacked structure 80, from a physical perspective, the conductive vias are still in a direct connection configuration. However, from a perspective of absolute locations of the conductive vias on the active surface, the conductive vias may be considered as a functional rotational configuration, that is, a signal transmission effect (that is, a rotational transmission effect such as the conductive via D0—the conductive via D1—the conductive via D2—the conductive via D3 . . . ) similar to that in FIG. 2B is implemented through the physical direct connection configuration. In addition, in FIG. 2A and FIG. 2B, a signal transmission channel in the chip-stacked structure including eight memory chips can be transmitted only to two memory chips (for example, the signal Signal_CH0 is transmitted to the memory chip 0 and the memory chip 4), while a signal transmission channel in the chip-stacked structure 80 in this embodiment of the present disclosure can be transmitted to all the memory chips.

It may be learned from the foregoing descriptions that in this embodiment of the present disclosure, although one connection point on the logic chip corresponds to four different connection points on the first memory chip, the second memory chip, the third memory chip, and the fourth memory chip, because every two conductive vias in the same dummy conductive via group transmit the same global signal, the memory chips flipped to different locations can receive, through two signal transmission channels, the same global signal output by the logic chip. That is, every two conductive vias in the same dummy conductive via group transmit the same global signal, that is, the two formed signal transmission channels are mutually redundant, and when one signal transmission channel cannot normally transmit a global signal due to defects of some conductive vias, the other redundant signal transmission channel can still ensure that all the memory chips can receive the correct global signal, to achieve a repair effect. In addition, in the case of 4-quadrant symmetry in each chip, in the global signal region, at least two conductive vias need to be configured to transmit the same global signal to achieve a redundancy repair effect. Generally, to ensure that all of four types of memory chips (that is, the first memory chip, the second memory chip, the third memory chip, and the fourth memory chip) at different stacking locations can receive the global signal, the logic chip needs at least eight conductive vias (that is, four groups of conductive vias, with each including two conductive vias, respectively corresponding to the four types of memory chips at stacking locations) to transmit the global signal. However, in this embodiment of the present disclosure, the same global signal of the logic chip is transmitted only through two conductive vias, and every two global signals form one group. After the global signal is transmitted from the logic chip to memory chips at different stacking locations, the different memory chips are distinguished through location identification signals, so that switching is separately performed between different conductive vias in the memory chip to output the first global signal or the second global signal. The disposition of the conductive vias in this solution can achieve a redundancy repair effect of the global signal with a minimum quantity of conductive vias, reduce an occupied area of the global signal region, and further reduce an area of the memory chip.

Figure 20:
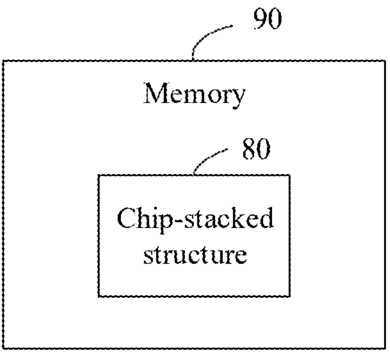
FIG. 20 is a schematic diagram of structural composition of a memory according to an embodiment of the present disclosure.

In yet another embodiment of the present disclosure, FIG. 20 is a schematic diagram of structural composition of a memory according to an embodiment of the present disclosure. As shown in FIG. 20, the memory 90 includes the chip-stacked structure 80 described in the foregoing embodiment.

In some embodiments, the chip-stacked structure 80 may be applied to the memory 90. The memory 90 may be a static random access memory (SRAM), a dynamic random access memory (DRAM), a synchronous dynamic random access memory (SDRAM), a double data rate synchronous dynamic random access memory (DDR SDRAM), or the like. This is not specifically limited herein.

In this embodiment of the present disclosure, for the memory 90, a chip area can be reduced, and chip manufacturing costs can be lowered.

Details not disclosed in this embodiment of the present disclosure may be understood with reference to the descriptions of the foregoing embodiment.

The foregoing descriptions are merely example embodiments of the present disclosure, and are not intended to limit the protection scope of the present disclosure.

It should be noted that in the present disclosure, the terms "include", "comprise", or any other variant thereof are intended to cover non-exclusive inclusion, so that a procedure, method, article, or apparatus that includes a series of elements includes not only those elements but also other elements that are not expressly listed, or further includes elements inherent to such a procedure, method, article, or apparatus. An element preceded by "includes a . . . " does not, without more constraints, preclude the presence of additional identical elements in the procedure, method, article, or apparatus that includes the element.

The sequence numbers of the foregoing embodiments of the present disclosure are merely for the purpose of description, and do not represent priorities of the embodiments.

The methods disclosed in the several method embodiments provided in the present disclosure may be randomly combined when there is no conflict, to obtain new method embodiments.

The features disclosed in the several product embodiments provided in the present disclosure may be randomly combined when there is no conflict, to obtain new product embodiments.

The features disclosed in the several method or device embodiments provided in the present disclosure may be randomly combined when there is no conflict, to obtain new method embodiments or new device embodiments.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

INDUSTRIAL APPLICABILITY

Embodiments of the present disclosure provide a memory chip, a logic chip, a chip-stacked structure, and a memory. Conductive vias with special symmetry are utilized to reduce quantities of disposed drive circuits and data selectors, thereby reducing parasitic capacitance. In addition, a chip-stacked structure including the memory chip and the logic chip implements a rotational signal transmission effect through a direct connection configuration of the conductive vias, and further reduces parasitic resistance. Further, in the same conductive via group, two conductive vias are utilized to form a dummy conductive via group to transmit the same global signal, thereby achieving a redundancy repair effect. In addition, the disposition of the conductive vias can achieve a redundancy repair effect of the global signal with a minimum quantity of conductive vias, reduce an occupied area of the global signal region, and further reduce an area of the memory chip.

What is claimed is:

1. A memory chip, a center point of an active surface of the memory chip and an adjacent region of the center point being defined as a global signal region, and a center point of the global signal region coinciding with the center point of the active surface;

the global signal region being penetrated by a plurality of conductive via groups, each conductive via group comprising a first dummy conductive via group and a second dummy conductive via group, the first dummy conductive via group comprising a first conductive via and a fourth conductive via, and the second dummy conductive via group comprising a second conductive via and a third conductive via; and the first dummy conductive via group being configured to transmit a same first global signal, and the second dummy conductive via group being configured to transmit a same second global signal; and for each conductive via group, the first conductive via and the second conductive via being symmetric about a first axis, the third conductive via and the fourth conductive via being symmetric about the first axis, and the first conductive via and the fourth conductive via being symmetric about a second axis; and the first axis and the second axis being perpendicular to each other and intersecting at the center point of the active surface, the first axis being parallel to a first side edge of the memory chip, and the second axis being parallel to a second side edge of the memory chip.

2. The memory chip according to claim 1, wherein the memory chip further comprises a plurality of input selection circuits, one side of each input selection circuit is coupled to one conductive via group, and the other side of each input selection circuit is coupled to one first signal input node and one second signal input node inside the memory chip; and the input selection circuit is configured to: electrically connect the coupled first dummy conductive via group to the coupled first signal input node, and electrically connect the coupled second dummy conductive via group to the coupled second signal input node; or electrically connect the coupled first dummy conductive via group to the coupled second signal input node, and electrically connect the coupled second dummy conductive via group to the coupled first signal input node.

3. The memory chip according to claim 2, wherein the input selection circuit comprises a first OR gate, a second OR gate, a first signal selection circuit, and a second signal selection circuit;

the first OR gate is coupled to the first conductive via and a fourth conductive via, and is configured to: perform an OR operation on a signal of the first conductive via and a signal of the fourth conductive via, and output a first intermediate signal;

the second OR gate is coupled to the second conductive via and a third conductive via, and is configured to: perform an OR operation on a signal of the second conductive via and a signal of the third conductive via, and output a second intermediate signal;

a first terminal of the first signal selection circuit receives the first intermediate signal, and a second terminal of the first signal selection circuit receives the second intermediate signal; and the first signal selection circuit is configured to: receive a location identification signal, and transmit one of the first intermediate signal and the second intermediate signal to the first signal input node based on the location identification signal; and a first terminal of the second signal selection circuit receives the second intermediate signal, and a second terminal of the second signal selection circuit receives the first intermediate signal; and the second signal selection circuit is configured to: receive the location identification signal, and transmit the other one of the first intermediate signal and the second intermediate signal to the second signal input node based on the location identification signal.

4. The memory chip according to claim 3, wherein every four memory chips are stacked into one stacked unit in a third direction, and in each stacked unit, a low-order transmission region of a memory chip at a first-type location and a high-order transmission region of a memory chip at a second-type location are aligned in the third direction; and each memory chip is divided into a low-order transmission region and a high-order transmission region by a first axis, or each memory chip is divided into a low-order transmission region and a high-order transmission region by the second axis; and the memory chip further comprises:

a decoding circuit, coupled to the first signal selection circuit and the second signal selection circuit and configured to: receive a chip location identification code, the chip location identification code comprising a high-order location parameter and a low-order location parameter; and output the location identification signal in a first state if the chip location identification code indicates that the memory chip is located at the first-type location; or output the location identification signal in a second state if the chip location identification code indicates that the memory chip is located at the second-type location.

5. The memory chip according to claim 4, wherein for each stacked unit, a first memory chip and a fourth memory chip are located at the first-type location, and a second memory chip and a third memory chip are located at the second-type location; and the decoding circuit is a two-input XOR gate; and a first input terminal of the two-input XOR gate is configured to receive the low-order location parameter, a second input terminal of the two-input XOR gate is configured to receive the high-order location parameter, and an output terminal of the two-input XOR gate is configured to output the location identification signal.

6. The memory chip according to claim 4, wherein for each stacked unit, a first memory chip and a second memory chip are located at the first-type location, and a third memory chip and a fourth memory chip are located at the second-type location; and the decoding circuit determines the high-order location parameter as the location identification signal.

7. The memory chip according to claim 3, wherein the first signal selection circuit comprises a first driver and a first data selector, and the second signal selection circuit comprises a second driver and a second data selector;

a first terminal of the first data selector receives the first intermediate signal, a second terminal of the first data selector receives the second intermediate signal, a third terminal of the first data selector is coupled to a first terminal of the first driver, and a second terminal of the first driver is coupled to the first signal input node; and a first terminal of the second data selector receives the second intermediate signal, a second terminal of the second data selector receives the first intermediate signal, a third terminal of the second data selector is coupled to a first terminal of the second driver, and a second terminal of the second driver is coupled to the second signal input node.

8. The memory chip according to claim 1, wherein each conductive via is connected to a weak pull-down circuit; and the weak pull-down circuit comprises a resistor and a grounding terminal; and the weak pull-down circuit controls a level state of the conductive via to be a low level if the conductive via transmits no signal or is connected abnormally; or a level state of the conductive via depends on a transmitted signal if the conductive via is connected normally and transmits the signal.

9. The memory chip according to claim 1, wherein the memory chip further comprises a plurality of output selection circuits, one side of each output selection circuit is coupled to one first signal output node and one second signal output node inside the memory chip, and the other side of each output selection circuit is coupled to one conductive via group; and the output selection circuit is configured to: electrically connect the coupled first signal output node to the coupled first dummy conductive via group, and electrically connect the coupled second signal output node to the coupled second dummy conductive via group; or electrically connect the coupled first signal output node to the coupled second dummy conductive via group, and electrically connect the coupled second signal output node to the coupled first dummy conductive via group;

wherein the output selection circuit comprises a third signal selection circuit and a fourth signal selection circuit;

a first terminal of the third signal selection circuit is coupled to the first signal output node, a second terminal of the third signal selection circuit is coupled to the second signal output node, and a third terminal of the third signal selection circuit is coupled to the first dummy conductive via group; and the third signal selection circuit is configured to: receive a location identification signal, and electrically connect one of the first signal output node and the second signal output node to the first dummy conductive via group based on the location identification signal; and a first terminal of the fourth signal selection circuit is coupled to the second signal output node, a second terminal of the fourth signal selection circuit is coupled to the first signal output node, and a third terminal of the fourth signal selection circuit is coupled to the second dummy conductive via group; and the fourth signal selection circuit is configured to: receive the location identification signal, and electrically connect the other one of the first signal output node and the second signal output node to the second dummy conductive via group based on the location identification signal; and, wherein the third signal selection circuit comprises a third driver and a third data selector, and the fourth signal selection circuit comprises a fourth driver and a fourth data selector;

a first terminal of the third data selector is coupled to the first signal output node, a second terminal of the third data selector is coupled to the second signal output node, a third terminal of the third data selector is coupled to a first terminal of the third driver, and a second terminal of the third driver is coupled to the first dummy conductive via group; and a first terminal of the fourth data selector is coupled to the second signal output node, a second terminal of the fourth data selector is coupled to the first signal output node, a third terminal of the fourth data selector is coupled to a first terminal of the fourth driver, and a second terminal of the fourth driver is coupled to the second dummy conductive via group.

10. The memory chip according to claim 1, wherein the memory chip further comprises a plurality of bidirectional selection circuits, one side of each bidirectional selection circuit is coupled to one conductive via group, and the other side of each bidirectional selection circuit is coupled to one first bidirectional signal node and one second bidirectional signal node inside the memory chip;

the bidirectional selection circuit is configured to: electrically connect the coupled first dummy conductive via group to the coupled first bidirectional signal node, and electrically connect the coupled second dummy conductive via group to the coupled second bidirectional signal node; or electrically connect the coupled first dummy conductive via group to the coupled second bidirectional signal node, and electrically connect the coupled second dummy conductive via group to the coupled first bidirectional signal node; and the bidirectional selection circuit is further configured to: receive an input enable signal and an output enable signal; and transmit, through driving, a signal received from the first dummy conductive via group to a bidirectional signal node coupled to the bidirectional selection circuit, and transmit, through driving, a signal received from the second dummy conductive via group to the bidirectional signal node coupled to the bidirectional selection circuit, when the input enable signal is in an enabled state; or transmit, through driving, a signal received from the first bidirectional signal node to a dummy conductive via group coupled to the bidirectional selection circuit, and transmit, through driving, a signal received from the second bidirectional signal node to the dummy conductive via group coupled to the bidirectional selection circuit, when the output enable signal is in an enabled state; and, wherein the bidirectional selection circuit further comprises a first OR gate, a second OR gate, a first bidirectional selection circuit, and a second bidirectional selection circuit;

the first OR gate is coupled to the first conductive via and a fourth conductive via, and is configured to: perform an OR operation on a signal of the first conductive via and a signal of the fourth conductive via, and output a first intermediate signal;

the second OR gate is coupled to the second conductive via and a third conductive via, and is configured to: perform an OR operation on a signal of the second conductive via and a signal of the third conductive via, and output a second intermediate signal;

the first bidirectional selection circuit is configured to: receive a location identification signal, and transmit one of the first intermediate signal and the second intermediate signal to the first bidirectional signal node based on the location identification signal, when the input enable signal is in the enabled state;

the second bidirectional selection circuit is configured to: receive the location identification signal, and transmit the other one of the first intermediate signal and the second intermediate signal to the second bidirectional signal node based on the location identification signal, when the input enable signal is in the enabled state;

the first bidirectional selection circuit is further configured to: receive the location identification signal, and transmit, to one of the first dummy conductive via group and the second dummy conductive via group based on the location identification signal, the signal output by the first bidirectional signal node, when the output enable signal is in the enabled state; and the second bidirectional selection circuit is further configured to: receive the location identification signal, and transmit, to the other one of the first dummy conductive via group and the second dummy conductive via group based on the location identification signal, the signal output by the second bidirectional signal node, when the output enable signal is in the enabled state.

11. A chip-stacked structure, the chip-stacked structure comprising a logic chip and at least one stacked unit, and the logic chip and the at least one stacked unit being sequentially stacked in a third direction; each stacked unit comprising a first memory chip, a second memory chip, a third memory chip, and a fourth memory chip that are sequentially stacked in the third direction, and the third direction being perpendicular to a top surface of each memory chip; and each of the first memory chip, the second memory chip, the third memory chip, and the fourth memory chip being the memory chip according to claim 1;

the first memory chip and the second memory chip being stacked in a face-to-face manner, the second memory chip and the third memory chip being stacked in a back-to-back manner, and the third memory chip and the fourth memory chip being stacked in the face-to-face manner; and a first memory chip in a first stacked unit and the logic chip being stacked in a back-to-face manner, or a first memory chip in a first stacked unit and the logic chip being stacked in the back-to-back manner; and n conductive via groups in the logic chip being in a one-to-one correspondence with and aligned in the third direction with n conductive via groups in each first memory chip, n conductive via groups in each second memory chip, n conductive via groups in each third memory chip, and n conductive via groups in each fourth memory chip, and n being a positive integer.

12. The chip-stacked structure according to claim 11, wherein a center point of an active surface of the logic chip and an adjacent region of the center point being defined as a global signal region, and a center point of the global signal region coinciding with the center point of the active surface;

the global signal region being penetrated by a plurality of conductive via groups, each conductive via group comprising a first dummy conductive via group and a second dummy conductive via group, the first dummy conductive via group comprising a first conductive via and a fourth conductive via, and the second dummy conductive via group comprising a second conductive via and a third conductive via; and the first dummy conductive via group being configured to transmit a same first global signal, and the second dummy conductive via group being configured to transmit a same second global signal; and for each conductive via group, the first conductive via and the second conductive via being symmetric about a first axis, the third conductive via and the fourth conductive via being symmetric about the first axis, and the first conductive via and the fourth conductive via being symmetric about a second axis; and the first axis and the second axis being perpendicular to each other and intersecting at the center point of the active surface, the first axis being parallel to a first side edge of the logic chip, and the second axis being parallel to a second side edge of the logic chip.

13. The chip-stacked structure according to claim 12, wherein there are the following cases when the logic chip and the first memory chip are stacked in a back-to-back manner:

a fourth conductive via in an ith first dummy conductive via group in the logic chip, a first conductive via in an ith first dummy conductive via group in each first memory chip, a second conductive via in an ith second dummy conductive via group in each second memory chip, a third conductive via in an ith second dummy conductive via group in each third memory chip, and a fourth conductive via in an ith first dummy conductive via group in each fourth memory chip are aligned in the third direction, and constitute one signal transmission channel;

a third conductive via in an ith second dummy conductive via group in the logic chip, a second conductive via in an ith second dummy conductive via group in each first memory chip, a first conductive via in an ith first dummy conductive via group in each second memory chip, a fourth conductive via in an ith first dummy conductive via group in each third memory chip, and a third conductive via in an ith second dummy conductive via group in each fourth memory chip are aligned in the third direction, and constitute one signal transmission channel;

a second conductive via in the ith second dummy conductive via group in the logic chip, a third conductive via in the ith second dummy conductive via group in each first memory chip, a fourth conductive via in the ith first dummy conductive via group in each second memory chip, a first conductive via in the ith first dummy conductive via group in each third memory chip, and a second conductive via in the ith second dummy conductive via group in each fourth memory chip are aligned in the third direction, and constitute one signal transmission channel; and a first conductive via in the ith first dummy conductive via group in the logic chip, a fourth conductive via in the ith first dummy conductive via group in each first memory chip, a third conductive via in the ith second dummy conductive via group in each second memory chip, a second conductive via in the ith second dummy conductive via group in each third memory chip, and a first conductive via in the ith first dummy conductive via group in each fourth memory chip are aligned in the third direction, and constitute one signal transmission channel, wherein i is a positive integer less than or equal to n.

14. The chip-stacked structure according to claim 13, wherein a high-order transmission region of the first memory chip, a low-order transmission region of the second memory chip, a low-order transmission region of the third memory chip, and a high-order transmission region of the fourth memory chip are aligned; or a high-order transmission region of the first memory chip, a high-order transmission region of the second memory chip, a low-order transmission region of the third memory chip, and a low-order transmission region of the fourth memory chip are aligned.

15. The chip-stacked structure according to claim 12, wherein there are the following cases when the logic chip and the first memory chip are stacked in the back-to-back manner:

a second conductive via in an ith second dummy conductive via group in the logic chip, a first conductive via in an ith first dummy conductive via group in each first memory chip, a second conductive via in an ith second dummy conductive via group in each second memory chip, a third conductive via in an ith second dummy conductive via group in each third memory chip, and a fourth conductive via in an ith first dummy conductive via group in each fourth memory chip are aligned in the third direction, and constitute one signal transmission channel;

a first conductive via in an ith first dummy conductive via group in the logic chip, a second conductive via in an ith second dummy conductive via group in each first memory chip, a first conductive via in an ith first dummy conductive via group in each second memory chip, a fourth conductive via in an ith first dummy conductive via group in each third memory chip, and a third conductive via in an ith second dummy conductive via group in each fourth memory chip are aligned in the third direction, and constitute one signal transmission channel;

a fourth conductive via in the ith first dummy conductive via group in the logic chip, a third conductive via in the ith second dummy conductive via group in each first memory chip, a fourth conductive via in the ith first dummy conductive via group in each second memory chip, a first conductive via in the ith first dummy conductive via group in each third memory chip, and a second conductive via in the ith second dummy conductive via group in each fourth memory chip are aligned in the third direction, and constitute one signal transmission channel; and a third conductive via in the ith second dummy conductive via group in the logic chip, a fourth conductive via in the ith first dummy conductive via group in each first memory chip, a third conductive via in the ith second dummy conductive via group in each second memory chip, a second conductive via in the ith second dummy conductive via group in each third memory chip, and a first conductive via in the ith first dummy conductive via group in each fourth memory chip are aligned in the third direction, and constitute one signal transmission channel.

16. The chip-stacked structure according to claim 15, wherein a high-order transmission region of the first memory chip, a low-order transmission region of the second memory chip, a low-order transmission region of the third memory chip, and a high-order transmission region of the fourth memory chip are aligned; or a high-order transmission region of the first memory chip, a high-order transmission region of the second memory chip, a low-order transmission region of the third memory chip, and a low-order transmission region of the fourth memory chip are aligned.

17. A memory, the memory comprising the chip-stacked structure according to claim 11.

18. A logic chip, a center point of an active surface of the logic chip and an adjacent region of the center point being defined as a global signal region, and a center point of the global signal region coinciding with the center point of the active surface;

the global signal region being penetrated by a plurality of conductive via groups, each conductive via group comprising a first dummy conductive via group and a second dummy conductive via group, the first dummy conductive via group comprising a first conductive via and a fourth conductive via, and the second dummy conductive via group comprising a second conductive via and a third conductive via; and the first dummy conductive via group being configured to transmit a same first global signal, and the second dummy conductive via group being configured to transmit a same second global signal; and for each conductive via group, the first conductive via and the second conductive via being symmetric about a first axis, the third conductive via and the fourth conductive via being symmetric about the first axis, and the first conductive via and the fourth conductive via being symmetric about a second axis; and the first axis and the second axis being perpendicular to each other and intersecting at the center point of the active surface, the first axis being parallel to a first side edge of the logic chip, and the second axis being parallel to a second side edge of the logic chip.

19. The logic chip according to claim 18, wherein the logic chip further comprises a plurality of first output drive circuits and a plurality of second output drive circuits;

one first output drive circuit is coupled to all conductive vias in one first dummy conductive via group, and one second output drive circuit is coupled to all conductive vias in one second dummy conductive via group;

the first output drive circuit is configured to send the first global signal generated inside the logic chip to all corresponding coupled conductive vias; and the second output drive circuit is configured to send the second global signal generated inside the logic chip to all corresponding coupled conductive vias; and, wherein the logic chip further comprises a plurality of input drive circuits, and each input drive circuit is coupled to one conductive via group;

the logic chip is configured to: send an enable control signal to a target memory chip, and receive, through the input drive circuit, the first global signal and the second global signal that are sent by the target memory chip; and each input drive circuit comprises a first input driver, a second input driver, a third OR gate, and a fourth OR gate; a first input terminal of the third OR gate is connected to the first conductive via, a second input terminal of the third OR gate is connected to the fourth conductive via, and an output terminal of the third OR gate is coupled to the first input driver; and a first input terminal of the fourth OR gate is connected to the second conductive via, a second input terminal of the fourth OR gate is connected to the third conductive via, and an output terminal of the fourth OR gate is coupled to the second input driver.

20. The logic chip according to claim 18, wherein each conductive via is connected to a weak pull-down circuit; and the weak pull-down circuit comprises a resistor and a grounding terminal; and the weak pull-down circuit controls a level state of the conductive via to be a low level if the conductive via transmits no signal or is connected abnormally; or a level state of the conductive via depends on a transmitted signal if the conductive via is connected normally and transmits the signal.

* * * * *